(12) United States Patent
Kono et al.

(10) Patent No.: US 9,580,303 B2
(45) Date of Patent: Feb. 28, 2017

(54) FLOW SENSOR AND METHOD FOR MANUFACTURING THE SAME

(71) Applicant: Hitachi Automotive Systems, Ltd., Hitachinaka-shi, Ibaraki (JP)

(72) Inventors: Tsutomu Kono, Tokyo (JP); Keiji Hanzawa, Hitachinaka (JP); Noboru Tokuyasu, Hitachinaka (JP); Shinobu Tashiro, Hitachinaka (JP)

(73) Assignee: Hitachi Automotive Systems, Ltd., Hitachinaka-shi (JP)

( * ) Notice: Subject to any disclaimer, the term of this patent is extended or adjusted under 35 U.S.C. 154(b) by 162 days.

(21) Appl. No.: 14/391,782

(22) PCT Filed: Apr. 11, 2013

(86) PCT No.: PCT/JP2013/060888
§ 371 (c)(1),
(2) Date: Oct. 10, 2014

(87) PCT Pub. No.: WO2013/154144
PCT Pub. Date: Oct. 17, 2013

(65) Prior Publication Data
US 2015/0107353 A1    Apr. 23, 2015

(30) Foreign Application Priority Data

Apr. 12, 2012  (JP) ................ 2012-091288

(51) Int. Cl.
*B81C 1/00* (2006.01)
*H01L 21/56* (2006.01)
(Continued)

(52) U.S. Cl.
CPC ........ *B81C 1/00309* (2013.01); *G01F 1/6845* (2013.01); *G01F 1/692* (2013.01);
(Continued)

(58) Field of Classification Search
CPC ................................................. B81C 1/00309
See application file for complete search history.

(56) References Cited

U.S. PATENT DOCUMENTS 6,081,978 A * 7/2000 Utsumi ................ H01L 21/565
249/102
6,396,139 B1 * 5/2002 Huang ................ H01L 21/565
257/676
(Continued)

FOREIGN PATENT DOCUMENTS

EP     2 339 302 A2   6/2011
JP     10-22314 A     1/1998
(Continued)

OTHER PUBLICATIONS

European Search Report issued in counterpart European Application No. 13775539.3 dated Nov. 4, 2015 (ten (10) pages).
(Continued)

*Primary Examiner* — Ryan Walsh
(74) *Attorney, Agent, or Firm* — Crowell & Moring LLP

(57) ABSTRACT

A technique capable of suppressing performance variation of every flow sensor and achieving performance improvement is provided. For example, in an arbitrary cross-sectional surface in parallel to a moving direction of a gas flowing on an exposed flow detecting unit FDU which is formed in a semiconductor chip CHP1, a sealing body is released from the lower mold BM by thrusting up, from a lower mold BM, an ejection pin EJPN arranged in an outer region of the semiconductor chip CHP1 so as not to overlap with the semiconductor chip CHP1 arranged in the vicinity of the center part. Thus, according to the first embodiment, the deformation applied to the sealing body at the time of mold releasing can be smaller than that in a case in which the sealing body is released from the lower mold BM by
(Continued)

arranging the ejection pin EJPN in a region overlapping with the semiconductor chip CHP1.

10 Claims, 19 Drawing Sheets

(51) Int. Cl.
    *G01F 1/684*     (2006.01)
    *G01F 1/698*     (2006.01)
    *G01F 1/692*     (2006.01)
    *H01L 23/31*     (2006.01)
    *H01L 23/00*     (2006.01)
    *H01L 23/495*     (2006.01)

(52) U.S. Cl.
    CPC ............ *G01F 1/698* (2013.01); *H01L 21/565* (2013.01); *B81C 2203/0118* (2013.01); *B81C 2203/0154* (2013.01); *H01L 21/566* (2013.01); *H01L 23/3107* (2013.01); *H01L 23/49575* (2013.01); *H01L 24/29* (2013.01); *H01L 24/32* (2013.01); *H01L 24/45* (2013.01); *H01L 24/48* (2013.01); *H01L 24/73* (2013.01); *H01L 24/92* (2013.01); *H01L 2224/04042* (2013.01); *H01L 2224/05554* (2013.01); *H01L 2224/2919* (2013.01); *H01L 2224/32245* (2013.01); *H01L 2224/45144* (2013.01); *H01L 2224/48091* (2013.01); *H01L 2224/48247* (2013.01); *H01L 2224/48257* (2013.01); *H01L 2224/73265* (2013.01); *H01L 2224/92247* (2013.01); *H01L 2924/10158* (2013.01); *H01L 2924/181* (2013.01); *H01L 2924/1815* (2013.01)

(56) References Cited

U.S. PATENT DOCUMENTS

| | | | | |
|---|---|---|---|---|
| 2011/0140211 | A1* | 6/2011 | Kono | ............... G01F 1/684 |
| | | | | 257/415 |
| 2012/0032316 | A1* | 2/2012 | Nishikawa | ............ H01L 21/565 |
| | | | | 257/676 |

FOREIGN PATENT DOCUMENTS

| | | |
|---|---|---|
| JP | 2000-216173 A | 8/2000 |
| JP | 2004-74713 A | 3/2004 |
| JP | 2009-58230 A | 3/2009 |
| JP | 2009-274345 A | 11/2009 |
| JP | 2011-122984 A | 6/2011 |

OTHER PUBLICATIONS

Japanese Office Action issued in counterpart Japanese Application No. 2012-091288 dated Sep. 15, 2015, with English translation (seven (7) pages).
International Search Report (PCT/ISA/210) dated Jul. 16, 2013, with English translation (Three (3) pages).
Japanese Written Opinion (PCT/ISA/237) dated Jul. 16, 2013 (Four (4) pages).

* cited by examiner

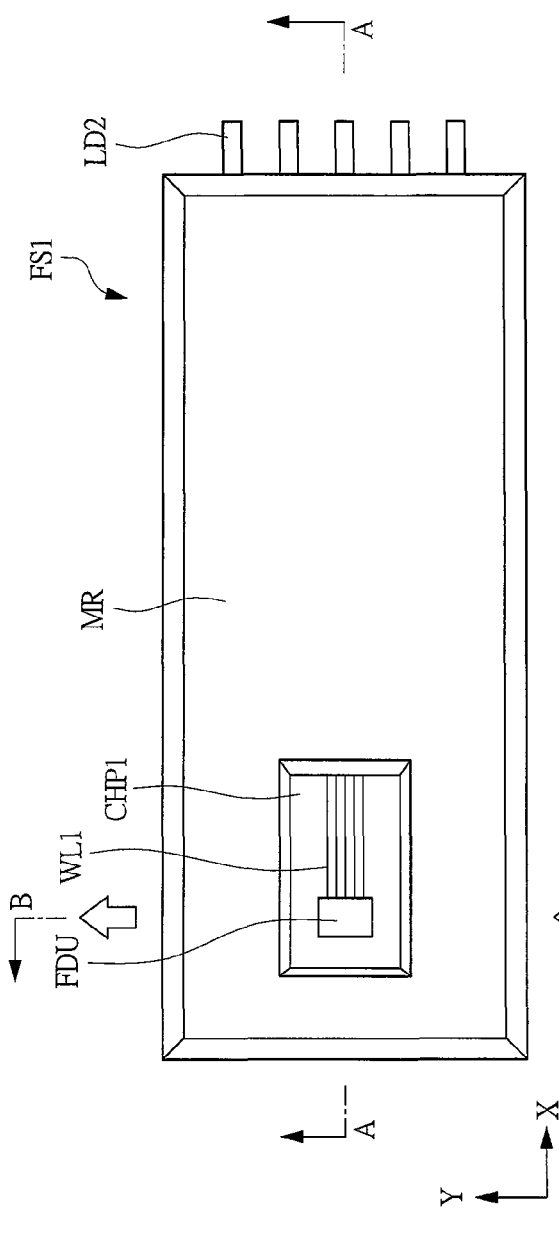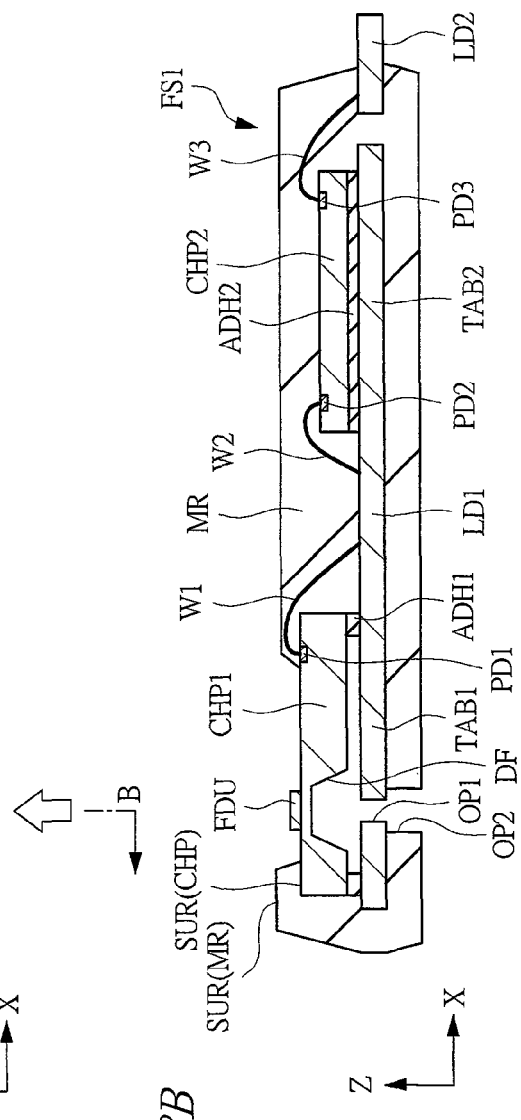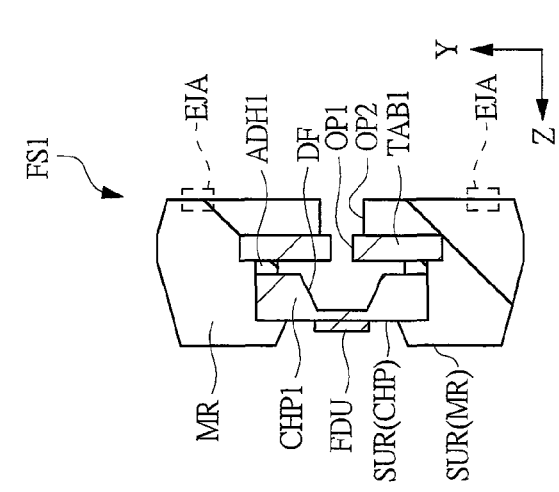

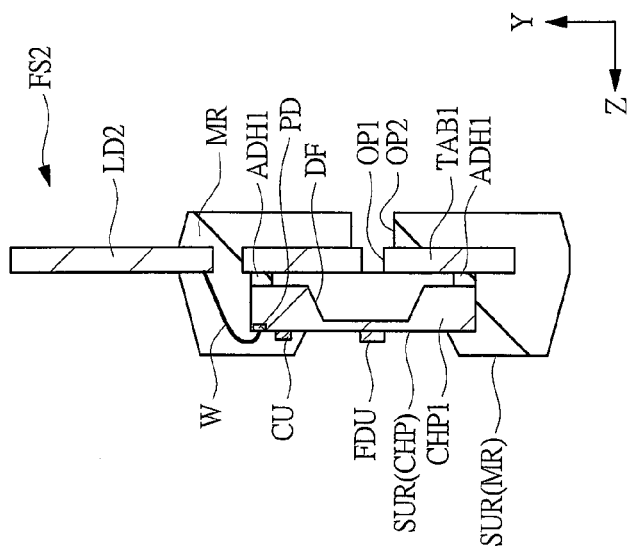
FIG. 24C
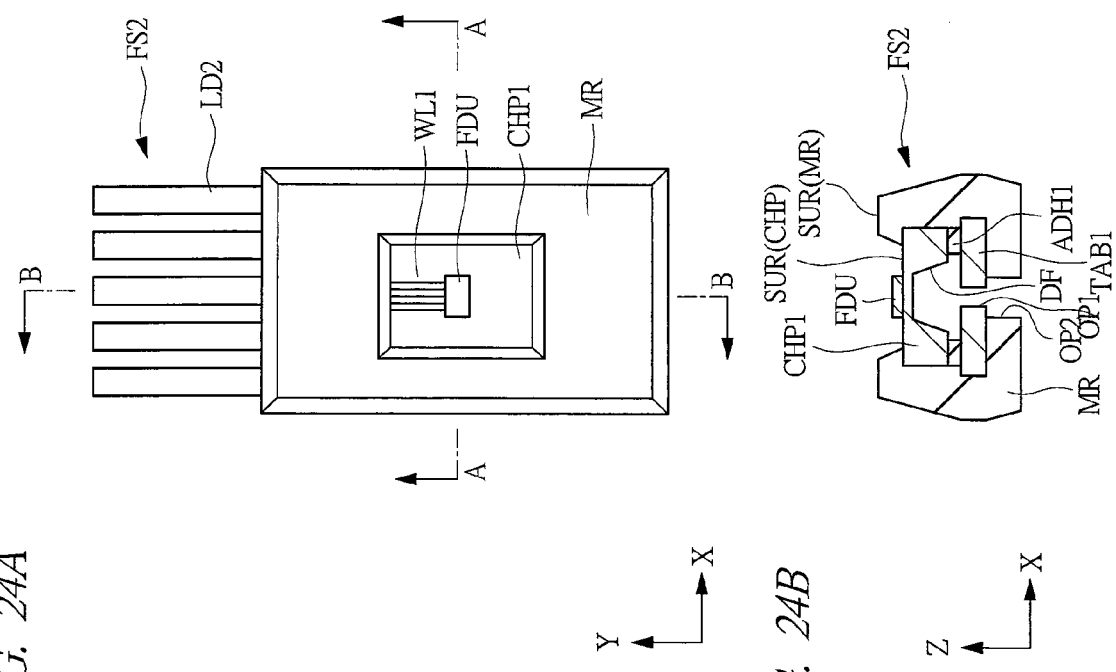
FIG. 24A
FIG. 24B

FLOW SENSOR AND METHOD FOR MANUFACTURING THE SAME

TECHNICAL FIELD

The present invention relates to a flow sensor and a technique for manufacturing the same, and, more particularly relates to a technique effectively applied to a resin-sealed type flow sensor and a technique for manufacturing the same.

BACKGROUND ART

Japanese Patent Application Laid-Open Publication No. 2004-74713 (Patent Document 1) discloses a technique for clamping a component by a mold in which a mold-releasing film sheet is placed and casting a resin as a method for manufacturing a semiconductor package.

PRIOR ART DOCUMENT

Patent Document

Patent Document 1: Japanese Patent Application Laid-Open Publication No. 2004-74713

SUMMARY OF THE INVENTION

Problems to be Solved by the Invention

For example, currently, an electronically-controlled fuel injection device is provided in an internal combustion engine for an automobile or others. This electronically-controlled fuel injection device has a role to efficiently operate the internal combustion engine by appropriately adjusting volumes of a gas (air) and the fuel flowing into the internal combustion engine. For this reason, it is necessary to accurately figure out the gas (air) flowing into the internal combustion engine in the electronically controlled fuel injection device. For this reason, a flow sensor (air flow sensor) for measuring a flow volume of the gas (air) is provided in the electronically-controlled fuel injection device.

Among flow sensors, a flow sensor manufactured by a semiconductor micromachining technique is particularly drawn the attention because its cost can be reduced and this can be driven by low electric power. Such a flow sensor has a configuration in which, for example, a diaphragm (thin plate section) is formed in a rear surface of a semiconductor substrate made of silicon by anisotropic etching, and a flow detecting unit having a heating resistor and a temperature sensing resistor is formed in a front surface of the semiconductor substrate facing this diaphragm.

A practical flow rate has a first semiconductor chip with the diaphragm and the flow detecting unit formed thereon, and besides, has a second semiconductor chip with a control circuit unit for controlling the flow detecting unit formed thereon. The above-described first semiconductor chip and second semiconductor chip are mounted on, for example, a substrate, and are electrically connected with a wiring (terminal) formed on the substrate. Specifically, for example, the first semiconductor chip is connected with a wiring formed in the substrate by a wire made of a gold wire, and the second semiconductor chip is connected with a wiring formed in the substrate with the use of a bump electrode formed in the second semiconductor chip. In this manner, the first semiconductor chip and second semiconductor chip mounted on the substrate are electrically connected with each other through the wiring formed in the substrate. As a result, the flow detecting unit formed in the first semiconductor chip can be controlled by the control circuit unit formed in the second semiconductor chip, and thus the flow sensor is configured.

At this time, the gold wire (wire) for connecting the first semiconductor chip and the substrate is normally fixed by a potting resin in order to prevent a contact due to a deformation. That is, the gold wire (wire) is covered and fixed by the potting resin so that the gold wire (wire) is protected by this potting resin. On the other hand, the first semiconductor chip and second semiconductor chip configuring the flow sensor are normally not sealed by the potting resin. That is, a normal flow sensor has such a configuration that only the gold wire (wire) is covered by the potting resin.

Here, the fixing of the gold wire (wire) by the potting resin has such a problem that a position of the first semiconductor chip is shifted from the mounting position due to shrinkage of the potting resin since this fixing is performed without fixing the first semiconductor chip by a mold or others. Furthermore, the potting resin is formed by dropping, and thus, there is a problem of the low dimension accuracy of the potting resin. As a result, the shift of the mounting position of the first semiconductor chip having the flow detecting unit formed thereon is caused in every flow sensor, and besides, a forming position of the potting resin is also slightly different, and thus, a variation in the detection performance of each flow sensor is caused. For this reason, in order to suppress the variation in the performance of each flow sensor, it is necessary to correct the detection performance for each flow sensor, and necessary to add a step for correcting the performance in the manufacturing step of the flow sensor. More particularly, if the step for correcting the performance takes long time, the throughput in the manufacturing step of the flow sensor decreases, and there is also a problem that a cost of the flow sensor increases. Moreover, the potting resin is not subjected to the acceleration of the hardening by heating, and therefore, the hardening of the potting resin takes long time, and the throughput in the manufacturing step of the flow sensor decreases.

An object of the present invention is to provide a technique capable of suppressing performance variation of every flow sensor to improve the performance (also including a case of achieving the improvement of the performance by improving reliability).

The above and other objects and novel characteristics of the present invention will be apparent from the description of the present specification and the accompanying drawings.

Means for Solving the Problems

The typical aspect of the inventions disclosed in the present application will be briefly described as follows.

For example, in a flow sensor in a typical embodiment, a sealing body is released from a lower mold by thrusting up, from the lower mold, an ejection pin arranged in an outer region of the semiconductor chip so as not to overlap with the semiconductor chip in an arbitrary cross-sectional surface which is in parallel to a moving direction of a gas flowing on an exposed flow detecting unit.

Effects of the Invention

The effects obtained by typical aspects of the present invention will be briefly described below.

Performance variation of every flow sensor is suppressed and thus the performance can be improved.

BRIEF DESCRIPTIONS OF THE DRAWINGS

FIG. 8A is a plan view showing a mounting configuration of the flow sensor according to the first embodiment, FIG. 8B is a cross-sectional view obtained by cutting FIG. 8A on a line A-A, and FIG. 8C is a cross-sectional view obtained by cutting FIG. 8A on a line B-B;

FIG. 24A is a plan view showing a mounting structure of a flow sensor in a second embodiment, FIG. 24B is a cross-sectional view obtained by cutting FIG. 24A on a line A-A, and FIG. 24C is a cross-sectional view obtained by cutting FIG. 24A on a line B-B.

BEST MODE FOR CARRYING OUT THE INVENTION

In the embodiments described below, the invention will be described in a plurality of sections or embodiments when required as a matter of convenience. However, these sections or embodiments are not irrelevant to each other unless otherwise stated, and the one relates to the entire or a part of the other as a modification example, details, or a supplementary explanation thereof.

Also, in the embodiments described below, when referring to the number of elements (including number of pieces, values, amount, range, and the like), the number of the elements is not limited to a specific number unless otherwise stated or except the case where the number is apparently limited to a specific number in principle. The number larger or smaller than the specified number is also applicable.

Further, in the embodiments described below, it goes without saying that the components (including element steps) are not always indispensable unless otherwise stated or except the case where the components are apparently indispensable in principle.

Similarly, in the embodiments described below, when the shape of the components, positional relation thereof, and the like are described, the substantially approximate and similar shapes and the like are included therein unless otherwise stated or except the case where it is conceivable that they are apparently excluded in principle. The same goes for the numerical value and the range described above.

Also, the same components are denoted by the same reference symbols throughout all drawings for describing the embodiments, and the repetitive description thereof is omitted. Note that hatching is used even in a plan view so as to make the drawings easy to see.

First Embodiment

Circuit Configuration of Flow Sensor

Figure 1:
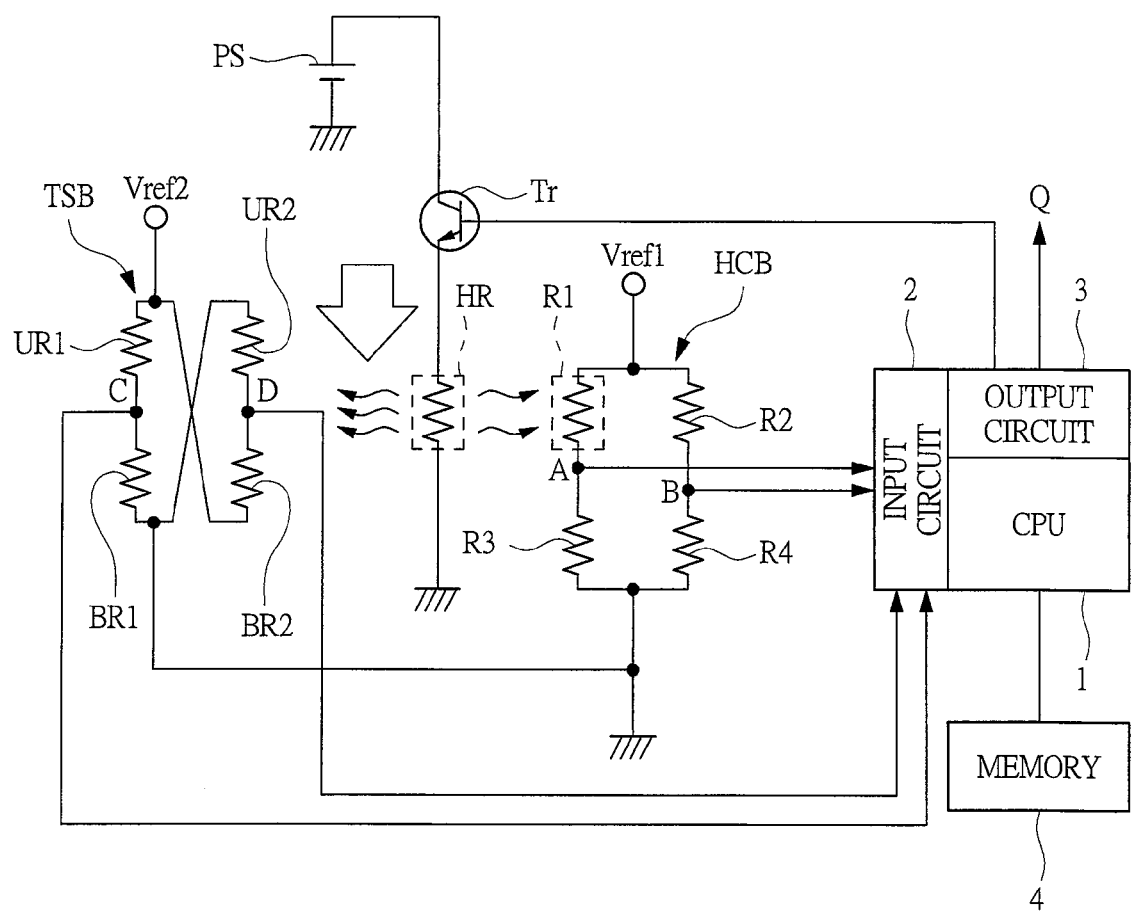
FIG. 1 is a circuit block diagram showing a circuit configuration of a flow sensor according to a first embodiment.

First, a circuit configuration of a flow sensor will be described. FIG. 1 is a circuit block diagram showing a circuit configuration of a flow sensor according to a first embodiment. In FIG. 1, the flow sensor of the first embodiment has, to begin with, a CPU (Central Processing Unit) 1 for controlling the flow sensor, and further, an input circuit 2 for inputting an input signal to this CPU1, and an output circuit 3 for outputting an output signal from the CPU1. The flow sensor is provided with a memory 4 for storing data, and the CPU1 has an access to the memory 4 and can refer to data stored in the memory 4.

Next, the CPU1 is connected to a base electrode of a transistor Tr through the output circuit 3. A collector electrode of this transistor Tr is connected to a power supply PS, and an emitter electrode of the transistor Tr is connected to a ground (GND) through a heating resistor HR. Consequently, the transistor Tr is controlled by the CPU1. That is, the base electrode of the transistor Tr is connected to the CPU1 through the output circuit 3 so that an output signal from the CPU1 is inputted to the base electrode of the transistor Tr.

As a result, a current flowing through the transistor Tr is controlled by the output signal (control signal) from the CPU1. When the current flowing through the transistor Tr is increased in accordance with the output signal from the CPU1, the current supplied to the heating resistor HR from the power supply PS is increased, and the amount of heating of the heating resistor HR is increased.

On the other hand, when the current flowing through the transistor Tr is decreased in accordance with the output signal from the CPU1, the current supplied to the heating resistor HR is decreased, and the amount of heating of the heating resistor HR is decreased.

In this manner, it is found that the flow sensor of the first embodiment is configured such that the amount of the current flowing through the heating resistor HR is controlled by the CPU1 and thus, the amount of heating from the heating resistor HR is controlled by the CPU1.

Subsequently, in the flow sensor of the first embodiment, since the current flowing through the heating resistor HR is controlled by the CPU1, a heater control bridge HCB is provided. This heater control bridge HCB is configured such that the amount of heating dissipated from the heating resistor HR is detected and the result of this detection is outputted to the input circuit 2. As a result, the CPU1 can input the detection result from the heater control bridge HCB, and based on this detection result, controls the current flowing through the transistor Tr.

Specifically, the heater control bridge HCB, as shown in FIG. 1, has resistors R1 to R4 configuring a bridge between a reference voltage Vref1 and the ground (GND). In the heater control bridge HCB thus configured, when temperature of a gas heated by the heating resistor HR is higher than an intake-air temperature by a certain specific temperature ($\Delta T$, for example, 100° C.), resistance values of the resistors R1 to R4 are set such that a potential difference between a node A and a node B is 0 V. In other words, the resistors R1 to R4 configuring the heater control bridge HCB configure a bridge in such a manner that a constituent element connecting the resistor R1 and the resistor R3 in series and a constituent element connecting the resistor R2 and the resistor R4 in series are connected in parallel between the reference voltage Vref1 and the ground (GND). The connecting point between the resistor R1 and the resistor R3 becomes the node A, and the connecting point between the resistor R2 and the resistor R4 becomes the node B.

At this time, the gas heated by the heating resistor HR is brought into contact with the resistor R1 configuring the heater control bridge HC. Consequently, the resistance value of the resistor R1 configuring the heater control bridge HCB is mainly changed by the amount of heating from the heating resistor HR. When the resistance value of the resistor R1 is changed in this manner, the potential difference between the node A and the node B is changed. Since this potential difference between the node A and the node B is inputted to the CPU1 through the input circuit 2, the CPU1 controls the current flowing through the transistor Tr based on the potential difference between the node A and the node B.

Specifically, the CPU1 controls the amount of heating from the heating resistor HR by controlling the current flowing through the transistor Tr so that the potential difference between the node A and the node B becomes 0 V. That is, it is found that the flow sensor according to the first embodiment is configured such that the CPU1 performs a feed back control based on the output of the heater control bridge HCB in order to maintain the temperature of the gas heated by the heating resistor HR at a specific value higher by a certain specific temperature ($\Delta T$, for example, 100° C.)

Subsequently, the flow sensor according to the first embodiment has a temperature sensor bridge TSB for detecting a flow rate of the gas. This temperature sensor bridge TSB includes four resistance thermometers configuring a bridge between a reference voltage Vref2 and the ground (GND). These four resistance thermometers include two upstream resistance thermometers UR1 and UR2 and two downstream resistance thermometers BR1 and BR2.

That is, the arrow direction of FIG. 1 shows a gas flow direction, and the upstream side of the gas flow direction is provided with the upstream resistance thermometers UR1 and UR2, and the downstream side is provided with the downstream resistance thermometers BR1 and BR2. These upstream resistance thermometers UR1 and UR2 and the downstream resistance thermometers BR1 and BR2 are arranged such that a distance to the heating resistor HR is the same.

In the temperature sensor bridge TSB, the upstream resistance thermometer UR1 and the downstream resistance thermometer BR1 are connected in series between the reference voltage Vref2 and the ground (GND), and this connecting point of the upstream resistance thermometer UR1 and the downstream resistance thermometer BR1 is a node C.

On the other hand, the upstream resistance thermometer UR2 and the downstream resistance thermometer BR2 are connected in series between the ground (GND) and the reference voltage Vref2, and this connecting point of the upstream resistance thermometer UR2 and the downstream resistance thermometer BR2 is a node D. The potentials of the node C and the node D are inputted to the CPU1 through the input circuit 2. When a windless state exists, in which a flow rate of the gas flowing in the arrow direction is zero, each resistance value of the upstream resistance thermometers UR1 and UR2 and the downstream resistance thermometers BR1 and BR2 is set such that the potential difference between the node C and the node D is 0 V.

Specifically, the upstream resistance thermometers UR1 and UR2 and the downstream resistance thermometers BR1 and BR2 are equal to each other in distance from the heating resistor HR, and are equal to each other in resistance value. Hence, it is found that the temperature sensor bridge TSB is configured such that the potential difference between the node C and the node D is 0 V if the windless state exists regardless of the amount of heating of the heating resistor HR.

<Operation of Flow Sensor>

The flow sensor according to the first embodiment is configured as described above, and its operation will be described below with reference to FIG. 1. First, the CPU1 supplies the current to the transistor Tr by outputting an output signal (control signal) to the base electrode of the transistor Tr through the output circuit 3. Then, the current flows into the heating resistor HR connected to the emitter electrode of the transistor Tr from the power supply PS that is connected to the collector electrode of the transistor Tr. Hence, the heating resistor HR produces heat. The gas warmed by heat generation from the heating resistor HR heats the resistor R1 that configures the heater control bridge HCB.

At this time, when the gas warmed by the heating resistor HR becomes higher by a specific temperature (for example, 100° C.), each resistance value of the resistors R1 to R4 is set such that the potential difference between the node A and the node B of the heater control bridge HCB is 0 V. Hence, for example, when the gas warmed by the heating resistor HR becomes higher by a specific temperature (for example, 100° C.), the potential difference between the node A and the node B of the heater control bridge HCB is 0 V, and this potential difference (0 V) is inputted to the CPU1 through the input circuit 2. The CPU1 which recognizes that the potential difference from the heater control bridge HCB is 0 V outputs an output signal (control signal) for maintaining the existing amount of current to the base electrode of the transistor Tr through the output circuit 3.

On the other hand, when the gas warmed by the heating resistor HR is shifted from a specific temperature (for example, 100° C.), a potential difference being not 0 V occurs between the node A and the node B of the heater control bridge HCB, and this potential difference is inputted to the CPU1 through the input circuit 2. The CPU1 which recognizes that the potential difference occurs from the heater control bridge HCB outputs an output signal (control signal) by which the potential difference becomes 0 V to the base electrode of the transistor Tr through the output circuit 3.

For example, when the potential difference occurs in the direction where the gas warmed by the heating resistor HR becomes higher by a specific temperature (for example, 100° C.), the CPU1 outputs a control signal (output signal) by which the current flowing through the transistor Tr is decreased to the base electrode of the transistor Tr. In contrast to this, when the potential difference occurs in the direction where the gas warmed by the heating resistor HR becomes lower than a specific temperature (for example, 100° C.), the CPU1 outputs a control signal (output signal) by which the current flowing through the transistor Tr is increased to the base electrode of the transistor Tr.

By operating as described above, the CPU1 performs a feedback control based on the output signal from the heater control bridge HCB so that the potential difference between the node A and the node B of the heater control bridge HCB is 0 V (equilibrium state). From this, it is understood that the gas warmed by the heating resistor HR is controlled to become a specific temperature in the flow sensor of the first embodiment.

Next, an operation for measuring the flow rate of the gas by the flow sensor according to the first embodiment will be described. First, the case where a windless state exists will be described. When the windless state exists in which the flow rate of the gas flowing to the arrow direction is zero, each resistance value of the upstream resistance thermometers UR1 and UR2 and the downstream resistance thermometers BR1 and BR2 is set such that the potential difference between the potential of the node C and the node D of the temperature sensor bridge TSB is 0 V.

Specifically, the upstream resistance thermometers UR1 and UR2 and the downstream resistance thermometers BR1 and BR2 are configured to be equal in distance from the heating resistor HR, and also equal in resistance value. Hence, if the temperature sensor bridge TSB is in a windless state regardless of the amount of heating of the heating resistor HR, the potential difference between the node C and the node D becomes 0 V, and this potential difference (0 V) is inputted to the CPU1 through the input circuit 2. The CPU1 which recognizes that the potential difference from the temperature sensor bridge TSB is 0 V recognizes that the flow rate of the gas flowing to the arrow direction is zero, and an output signal showing that the flow rate Q of the gas flowing through the output circuit 3 is zero is outputted from the flow sensor of the first embodiment.

Subsequently, a situation where the gas flows in the arrow direction of FIG. 1 is assumed. In this case, as shown in FIG. 1, the upstream resistance thermometers UR1 and UR2 arranged on the upper stream side in the gas flow direction are cooled by the gas flowing to the arrow direction. Hence, the temperatures of the upstream resistance thermometers UR1 and UR2 are dropped, whereas the downstream resistance thermometers BR1 and BR2 arranged on the downstream side in the gas flow direction rise in temperature since the gas warmed by the heating resistor HR flows to the downstream resistance thermometer BR1 and BR2. As a result, the balance of the temperature sensor bridge TSB is lost, and the potential difference being not 0 V occurs between the node C and the node D of the temperature sensor bridge TSB.

This potential difference is inputted to the CPU1 through the input circuit 2. Then, the CPU1, which has recognized that the potential difference from the temperature sensor bridge TSB is not zero, recognizes that the flow rate of the gas flowing in the arrow direction is not zero. After that, the CPU1 accesses the memory 4. Since the memory 4 stores a contrast list (table) corresponding to the potential difference and the gas flow rate, the CPU1 having an access to the memory 4 calculates the gas flow rate Q from the contrast table stored in the memory 4. In this way, the gas flow rate Q calculated by the CPU1 is outputted from the flow sensor of the first embodiment through the output circuit 3. According to the operation performed as described above, it is understood that the flow rate of the gas can be obtained according to the flow sensor of the first embodiment.

<Layout Configuration of Flow Sensor>

Next, a layout configuration of the flow sensor of the first embodiment will be described. For example, the flow sensor of the first embodiment shown in FIG. 1 is formed in the two semiconductor chips. Specifically, the heating resistor HR, the heat control bridge HCB, and the temperature sensor bridge TSB are formed on one semiconductor chip, whereas the CPU1, the input circuit 2, the output circuit 3, the memory 4 and the like are formed on the other semiconductor chip. The layout configuration of the semiconductor chip formed with the heating resistor HR, the heater control bridge HCB, and the temperature sensor bridge TSB will be described below.

Figure 2:
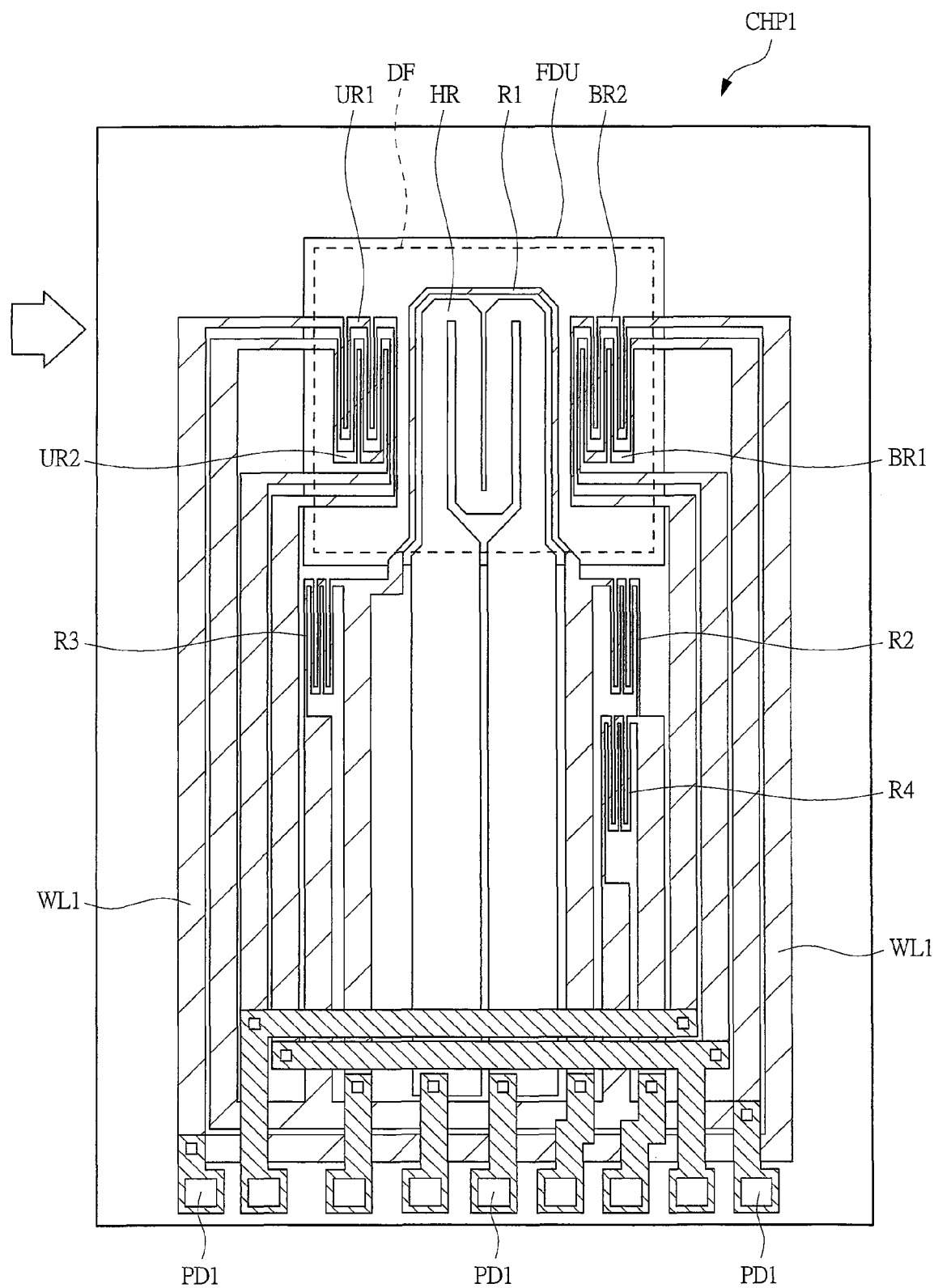
FIG. 2 is a plan view showing a layout configuration of a semiconductor chip that configures a part of the flow sensor according to the first embodiment.

FIG. 2 is a plan view showing the layout configuration of a semiconductor chip CHP1 that configures a part of the flow sensor of the first embodiment. First, as shown in FIG. 2, the semiconductor chip CHP1 is in a rectangular shape, and the gas flows from the left side of this semiconductor chip CHP1 to the right side (arrow direction). As shown in FIG. 2, a diaphragm DF having a rectangular shape is formed on the rear surface of the rectangular shaped semiconductor chip CHP1. The diaphragm DF means a thin plate region in which the thickness of the semiconductor chip CHP1 is made thin. In other words, the thickness of the region in which the diaphragm DF is formed is made thinner than the thicknesses of the region of the other semiconductor chip CHP1.

The surface region of the semiconductor chip CHP1 facing the rear surface region formed with the diaphragm in this manner is formed with the flow sensing unit FDU as shown in FIG. 2. Specifically, the center part of this flow sensing unit FDU is formed with the heating resistor HR, and around this heating resistor HR, the resistor R1 configuring the heat control bridge is formed. On the outer side of the flow sensing unit FDU, the resistors R2 to R4 configuring the heater control bridge are formed. By the resistors R1 to R4 formed in this way, the heater control bridge is formed.

Particularly, since the resistor R1 configuring the heater control bridge is formed in the vicinity of the heating resistor HR, the temperature of the gas warmed by heat generation from the heating resistor HR can be reflected to the resistor R1 with sufficient accuracy.

On the other hand, since the resistors R2 to R4 configuring the heater control bridge are arranged away from the heating resistor HR, the resistors R2 to R4 are hardly affected by heat generation from the heating resistor HR.

As a consequence, the resistor R1 can be configured to sensitively react to the temperature of the gas warmed by the heating resistor HR, whereas the resistors R2 to R4 can be configured to be hardly affected by the heating resistor HR and easy to maintain the resistance value at a specific value. Hence, the detection accuracy of the heater control bridge can be enhanced.

In addition, the upstream resistance thermometers UR1 and UR2 and the downstream resistance thermometers BR1 and BR2 are arranged in such a manner as to clamp the heating resistor HR formed on the flow sensing unit FDU. Specifically, the upstream resistance thermometers UR1 and UR2 are formed on the upstream side in the arrow direction to which the gas flows, and the downstream resistance thermometers BR1 and BR2 are formed on the downstream side in the arrow direction to which the gas flows.

With such a configuration, when the gas flows to the arrow direction, the temperatures of the upstream resistance thermometers UR1 and UR2 can be lowered, and the temperatures of the downstream resistance thermometers BR1 and BR2 can be increased. In this way, the temperature sensor bridge can be formed by the upstream resistance thermometers UR1 and UR2 and the downstream resistance thermometers BR1 and BR2 that are arranged in the flow sensing unit FDU.

The heating resistor HR, the upstream resistance thermometers UR1 and UR2, and the downstream resistance thermometers BR1 and BR2 described above are formed by patterning by a method such as ion etching after forming, for example, a metal film such as platinum and/or a semiconductor thin film such as polysilicon (polycrystalline silicon) by methods such as sputtering method, CVD (Chemical Vapor Deposition) method and/or the like.

The heating resistor HR thus configured, the resistors R1 to R4 configuring the heater control bridge, and the upstream resistance thermometers UR1 and UR2 and the downstream resistance thermometers BR1 and BR2 configuring the temperature sensor bridge are connected to wirings WL1, respectively, and are pulled out to pads PD1 arranged along the lower side of the semiconductor chip CHP1.

Thus, the semiconductor chip CHP1 configuring a part of the flow sensor of the first embodiment is laid out. The actual flow sensor has one semiconductor chip formed with the heating resistor HR, the heater control bridge HCB, and the temperature sensor bridge TSB, and another semiconductor chip formed with the CPU1, the input circuit 2, the output circuit 3, the memory 4 and the like, and mounts these semiconductor chips on the board. The flow sensor thus mounting these semiconductor chips on the board will be described below.

First, the mounting configuration of the flow sensor in the existing technology will be described. Then, the problem on the mounting configuration of the flow sensor in an existing technology will be described, and the mounting configuration of the flow sensor of the first embodiment devised to solve the problem on the mounting configuration of the flow sensor in the existing technology will be described.

Figure 3:
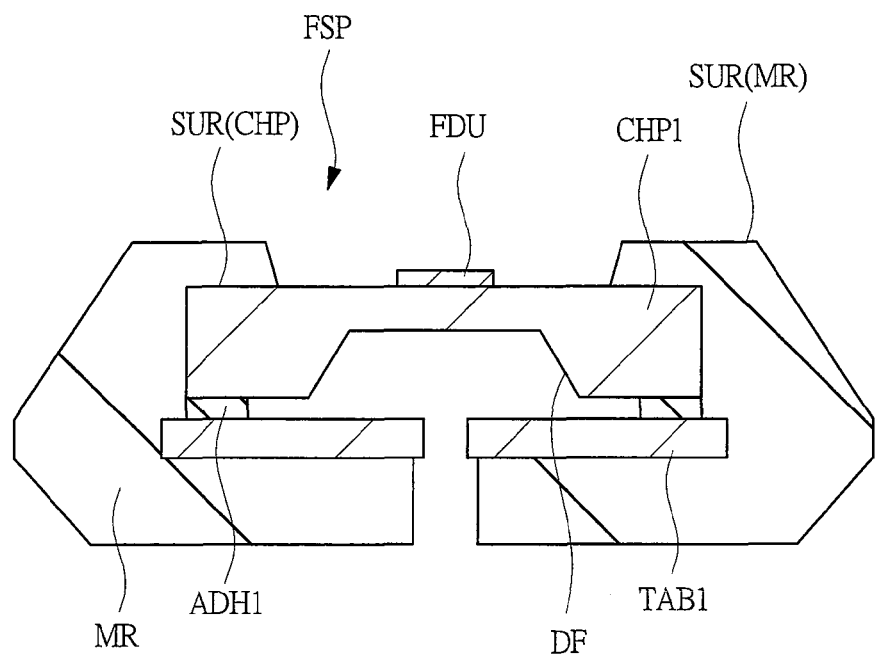
FIG. 3 is a cross-sectional view showing a configuration of a flow sensor according to the first related technique.

FIG. 3 is a cross-sectional view showing a configuration of a flow sensor FSP according to a first related technique. As shown in FIG. 3, the flow sensor FSP according to the first related technique has a semiconductor chip CHP1 on a chip mounting section TAB1, and this semiconductor chip CHP1 is bonded to the chip mounting section TAB1 by an adhesive ADH1. A flow detecting unit FDU is formed on a main surface (upper surface, front surface) of the semiconductor chip CHP1, and a diaphragm (thin plate section) DF is formed at a position facing the flow detecting unit FDU within a rear surface of the semiconductor chip CHP1. Furthermore, in the flow sensor FSP according to the first related technique, a part of the semiconductor chip CHP1 and a part of the chimp mounting section TAB1 are sealed by a sealing body containing a resin MR. Specifically, in the flow sensor FSP according to the first related technique, the resin MR is formed so as to cover a part of a side surface and the upper surface of the semiconductor chip CHP1 while exposing the flow detecting unit FDU formed in the upper surface of the semiconductor chip CHP1. At this time, in the flow sensor FSP according to the first related technique, a height of the upper surface SUR (CHP) of the semiconductor chip CHP1 is lower than a height of the upper surface SUR (MR) of the resin MR. In other words, it can also be said that the height of the upper surface SUR (MR) of the resin MR is higher than the height of the upper surface SUR (CHP) of the semiconductor chip CHP1.

Figure 4:
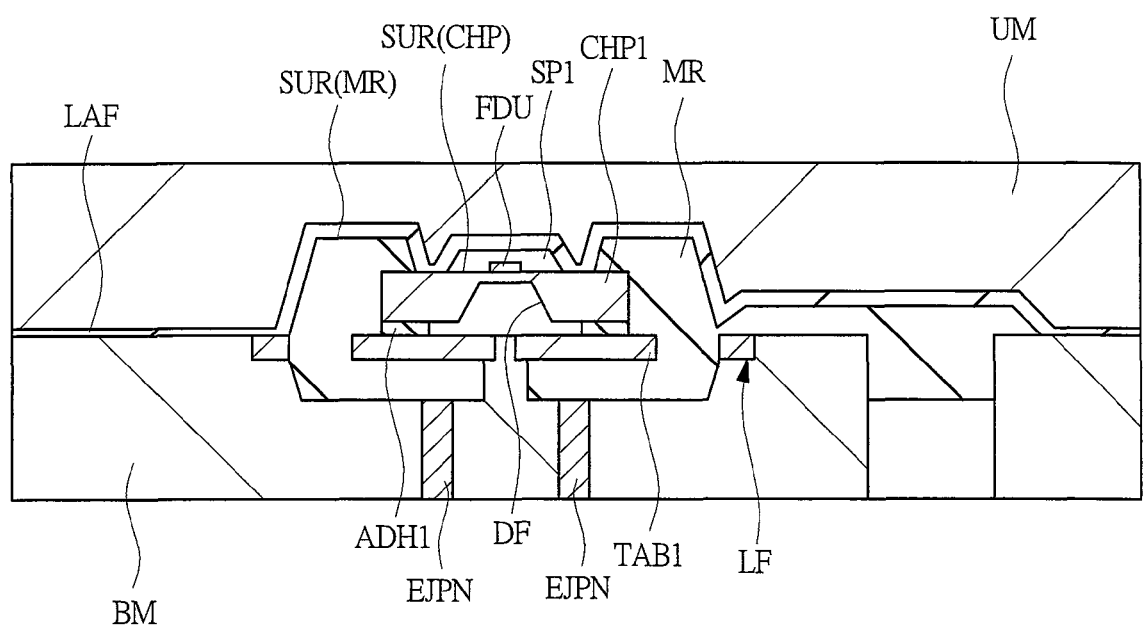
FIG. 4 is a cross-sectional view showing a step for resin-sealing the flow sensor according to the first related technique.

The flow sensor FSP thus configured according to the first related technique is resin-sealed by, for example, a manufacturing step shown in FIG. 4. FIG. 4 is a cross-sectional view showing a step for resin-sealing the flow sensor FSP according to the first related technique.

As shown in FIG. 4, the semiconductor chip CHP1 is fixed on the chip mounting section TAB1 formed on a lead frame LF by the adhesive ADH1. Furthermore, the lead frame LF on which the semiconductor chip CHP1 has been mounted is sandwiched by an upper mold UM and a lower mold BM through a second space. Then, a part of the semiconductor chip CHP1 is sealed with the resin MR by casting the resin MR into this second space under heating.

At this time, as shown in FIG. 4, an internal space of the diaphragm DF is isolated from the above-described second space by the adhesive ADH1, and thus, also at the time of filling the second space with the resin MR, entering of the resin MR into the internal space of the diaphragm DF can be prevented.

In addition, in the upper mold UM, a concave section is formed so as to secure a first space SP1 (enclosed space) surrounding the flow detecting unit FDU formed in the upper surface SUR (CHP) of the semiconductor chip CHP1. For this reason, when the upper mold UM is pressed against the semiconductor chip CHP1, while securing the first space SP1 (enclosed space) surrounding the flow detecting unit FDU formed in the semiconductor chip CHP1 and its vicinity region by the concave section formed in the upper mold UM, for example, a part of the side surface and the upper surface of the semiconductor chip CHP1 can be sealed. That is, according to the first related technique, a part of the semiconductor chip CHP1 can be sealed while exposing the flow detecting unit FDU formed in the semiconductor chip CHP1 and the vicinity region.

Here, in the first related technique, as shown in FIG. 4, an elastic body film LAF is interposed between the lead frame LF on which the semiconductor chip CHP1 has been mounted and the upper mold UM. Thus, for example, in a case that a thickness of the semiconductor chip CHP1 is thinner than an average thickness, a gap is generated when the lead frame LF on which the semiconductor chip CHP1 has been mounted is sandwiched by the upper mold UM and the lower mold BM. However, this gap can be filled with the elastic body film LAF, and thus resin leakage onto the semiconductor chip CHP1 can be prevented.

On the other hand, in a case that the thickness of the semiconductor chip CHP1 is thicker than the average thickness, when the lead frame LF on which the semiconductor chip CHP1 has been mounted is sandwiched by the upper mold UM and the lower mold BM, a dimension of the elastic body film LAF in the thickness direction changes so as to absorb the thickness of the semiconductor chip CHP1 since the elastic body film LAF is softer than the semiconductor chip CHP1. Thus, even if the thickness of the semiconductor chip CHP1 is thicker than the average thickness, application of a force more than necessary to the semiconductor chip CHP1 can be prevented, and as a result, the breakage of the semiconductor chip CHP1 can be prevented.

That is, according to a method for manufacturing a flow sensor according the first related technique, the semiconductor chip CHP1 is pressed by the upper mold UM through the elastic body film LAF. For this reason, a variation in mounting of components due to a variation in the thicknesses of the semiconductor chip CHP1, the adhesive ADH1, and the lead frame LF can be absorbed by the change in the thickness of the elastic body film LAF. In this manner, according to the first related technique, a clamping force applied to the semiconductor chip CHP1 can be relaxed. As a result, a damage represented by breaking, chipping, and cracking of the semiconductor chip CHP1 can be prevented. That is, according to a method for manufacturing a flow sensor according the first related technique, the semiconductor chip CHP1 can be protected from the damage represented by breaking, chipping, and cracking of the semiconductor chip CHP1, in accordance with an increase in the clamping force due to the variation in mounting of the components.

More specifically, FIG. 4 is a cross-sectional view as a manufacturing method showing a step for injecting the resin MR into a second space formed between the upper mold UM and the lower mold BM in a state that a component such as the semiconductor chip CHP1 mounted on the chip mounting section TAB1 of the lead frame LF is clamped by the lower mold BM and the upper mold UM with the elastic body film LAF set thereon. Particularly, FIG. 4 shows a cross-sectional view of a flow direction of the air (gas) of a flow sensor. As shown in FIG. 4, an end of the semiconductor chip CHP1 is pressed by the upper mold UM through the elastic body film LAF, and thus the semiconductor chip CHP1 is fixed by the upper mold UM.

In this manner, when the semiconductor chip CHP1 is sealed by the resin MR in the manufacturing method shown in FIG. 4, a flow sensor (see FIG. 3) in which a position of the upper surface SUR (MR) of the resin MR is higher than a position of the upper surface SUR (CHP) of the semiconductor chip CHP1 is manufactured.

The first related technique can be performed in a state in which the semiconductor chip CHP1 in which the flow detecting unit FDU is formed is fixed by a mold, and thus apart of the semiconductor chip CHP1 can be sealed by the resin MR while suppressing the positional shift of the semiconductor chip CHP1. This means that a method for manufacturing the flow sensor FSP in the first related technique can seal a part of the semiconductor chip CHP1 with the resin MR while suppressing the positional shift of each flow sensor, and means that the method can suppress a variation in a position of the flow detecting unit FDU formed in the semiconductor chip CHP1. As a result, according to the first related technique, the position of the flow detecting unit FDU for detecting the flow rate of a gas can be equalized in each flow sensor, and therefore, a variation in performance for detecting the gas flow rate in each flow sensor can be suppressed. That is, the first related technique in which a part of the semiconductor chip CHP1 is sealed while fixing by a mold can suppress a performance variation for each flow sensor FSP more than a technique using the potting resin.

Here, for example, in a manufacturing step of the flow sensor FSP for which a resin-sealing step is employed, it is necessary that a sealing body containing the resin MR is smoothly released from the lower mold BM. Accordingly, as shown in FIG. 4, an ejection pin (ejector pin) EJPN capable of moving up and down is normally inserted into the lower mold BM, and the sealing body after resin-sealing is released from the lower mold BM by using this ejection pin EJPN.

At this time, as shown in FIG. 4, in order to smoothly release the sealing body by equalizing a force applied to the sealing body by protruding the ejection pin EJPN, it is considered that positions of the ejection pin EJPN are arranged in the vicinity of positions at which a dimension of the sealing body in a lateral direction is divided into three equal parts. That is, as shown in FIG. 4, it is considered that the ejection pin EJPN is arranged at a position overlapping with the semiconductor chip CHP1 in a plane. In this case, although there is apparently no problem in the resin-sealing step shown in FIG. 4, the present inventors have newly found that a problem becomes obvious when the following second related technique is employed.

This second related technique will be described. For example, as also performed in the above-described first related technique, in the resin-sealing step, the sealing body is formed by sandwiching the lead frame LF on which the semiconductor chip CHP1 has been mounted by the upper mold UM and the lower mold BM, and then, injecting the resin MR into an enclosed space sandwiched by the upper mold UM and the lower mold BM. Therefore, position alignment accuracy at the time of sandwiching the lead frame LF on which the semiconductor chip CHP1 has been mounted by the upper mold UM and the lower mold BM becomes important. For this reason, for example, as the second related technique, it is considered that a positioning pin is inserted into a positioning hole, the positioning hole being provided in a dam bar configuring a part of the lead frame LF, and the positioning pin being provided in the lower mold BM. According to this second related technique, the lead frame LF can be securely fixed in the lower mold BM by inserting the positioning pin into the positioning hole, and therefore, the position alignment accuracy at the time of sandwiching the lead frame LF by the upper mold UM and the lower mold BM can be improved.

However, in the employment of the second related technique, when the position of the ejection pin EJPN is the same as that of the above-described first related technique from the viewpoint of improving the position alignment accuracy of the lower mold BM and the lead frame LF, a problem of difficulty in the smooth releasing becomes obvious. Hereinafter, this problem will be described.

Figure 5:
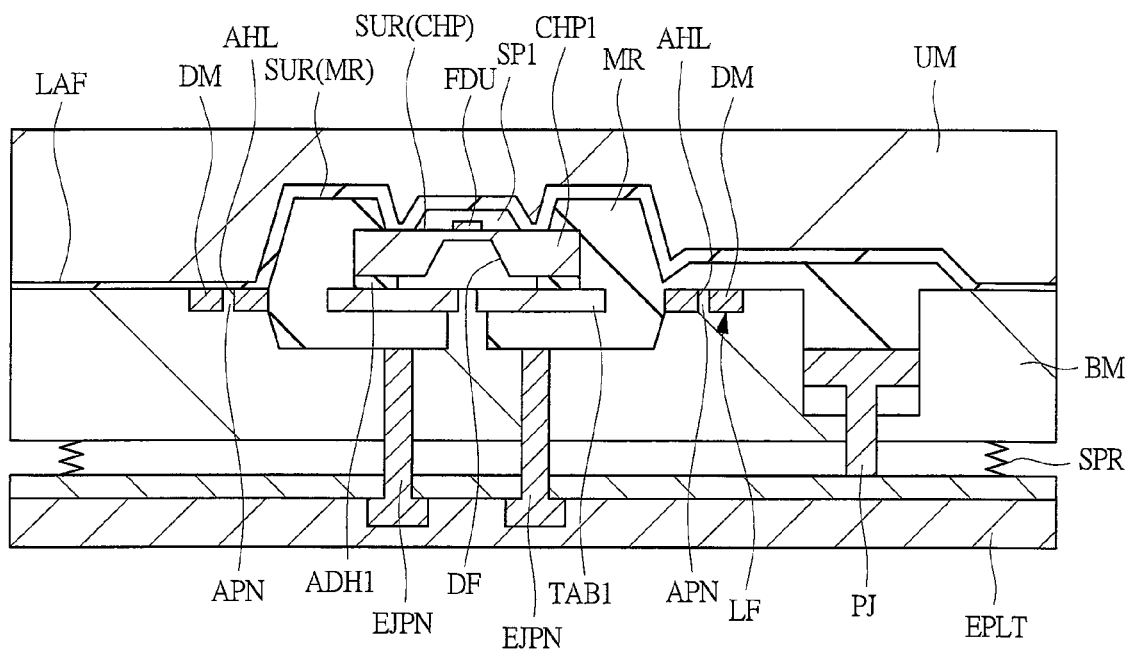
FIG. 5 is a cross-sectional view showing an aspect of performing a resin-sealing step with the use of the second related technique.

FIG. 5 is a cross-sectional view showing an aspect of performing a resin-sealing step with the use of the second related technique. Specifically, as shown in FIG. 5, the positioning hole AHL is formed in the dam bar DM configuring a part of the lead frame LF, and the positioning pin APN provided on the lower mold BM is inserted into this positioning hole AHL. As a result, according to the second related technique, the lead frame LF on which the semiconductor chip CHP1 has been mounted can be securely fixed in the lower mold BM, and thus the position alignment accuracy at the time of sandwiching the lead frame LF by the upper mold UM and the lower mold BM can be improved.

As shown in FIG. 5, normally, the sealing body is formed by casting the resin MR by a plunger PJ, and then, the sealing body is released from the lower mold BM with the use of the ejection pin EJPN inserted into the lower mold BM. This ejection pin EJPN is configured so as to be able to move up and down by an ejection pin plate EPLT, and the ejection pin plate EPLT is configured so as to be able to move in an up-and-down direction by a pressurization mechanism and a spring SPR of a molding equipment.

At this time, as shown in FIG. 5, a case of overlap of the ejection pin EJPN with the semiconductor chip CHP1 in a plane is considered. In other words, a case in which the positions of the ejection pins EJPN are arranged in the vicinity of the positions at which the dimension of the sealing body in the lateral direction is divided into three equal parts is considered. In this case, the position of the ejection pin EJPN and the position of the positioning pin APN are apart from each other.

Here, the positioning pin APN of the lower mold BM is inserted into the positioning hole AHL provided in the lead frame LF, and thus this part is difficult to be released more than the other parts of the lead frame LF. Moreover, the right positioning hole AHL shown in FIG. 5 is covered with a gate into which the resin MR is casted, and thus the right positioning hole AHL is difficult to be released because of being covered with the resin MR passing through the gate.

Figure 6:
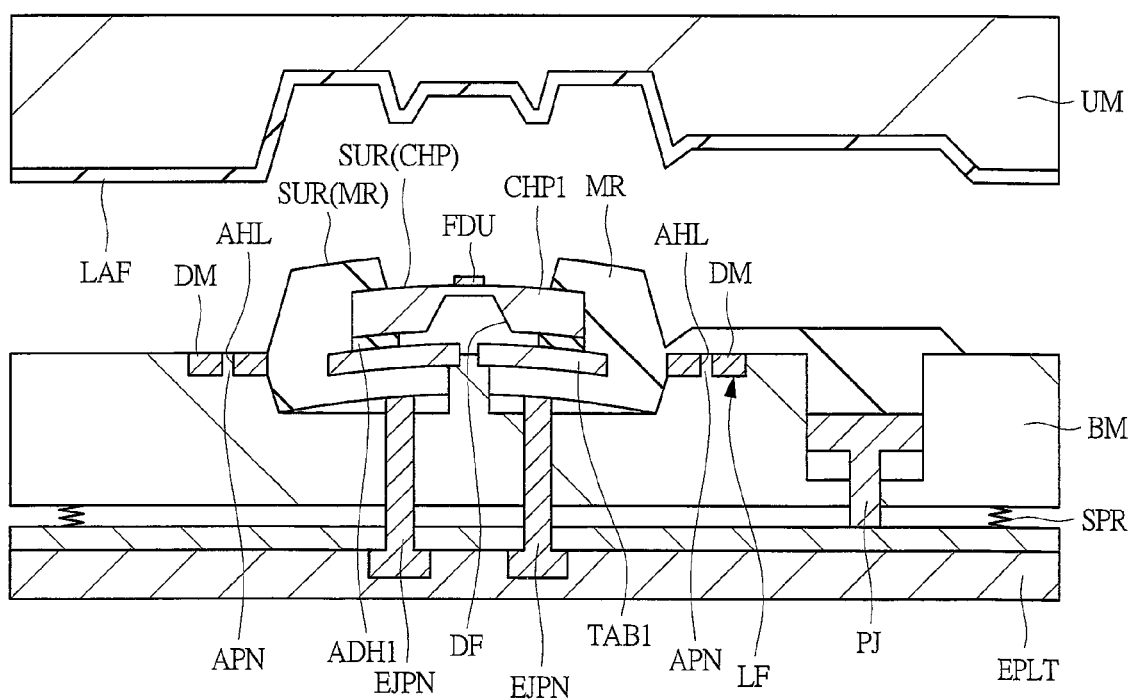
FIG. 6 is a cross-sectional view showing a mold releasing step in the second related technique.

Therefore, when the positions of the ejection pins EJPN are arranged in the vicinity of positions at which the dimension of the sealing body in the lateral direction is divided into three equal parts, a region immediately below the semiconductor chip CHP1 is released by applying a load by the ejection pin EJPN in a state in which the position of the ejection pin EJPN and the position of the positioning pin APN are apart from each other. At this time, as shown in FIG. 6, the connection part is difficult to be released due to the fact that the position of the ejection pin EJPN and the connection part at which the positioning pin APN is inserted into the positioning hole AHL are largely apart from each other, the fact that the positioning pin APN is difficult to be pulled out from the positioning hole AHL since this connection part is firmly fixed, and the fact that the upper part of this connection part is covered with the resin MR. That is, in the second related technique, as shown in FIG. 6, when the sealing body made of the resin MR is released from the lower mold BM by thrusting the ejection pin EJPN upward, the connection part which is apart from the ejection pin EJPN is difficult to be released therefrom.

As a result, a center part of the sealing body is lifted upward by the ejection pin EJPN in a state in which the sealing body is not released so that this connection part is a fulcrum point. For this reason, as shown in FIG. 6, when the sealing body is released from the lower mold BM, the sealing body is put in an upward-convex deformed state. In this case, the deformation becomes the largest at the center part of the sealing body. And, the semiconductor chip CHP1 is sealed at the center part of the sealing body, and the diaphragm DF that is the thin plate section is formed in the semiconductor chip CHP1. For this reason, the diaphragm DF formed in the semiconductor chip CHP1 is easily broken by the deformation caused when the sealing body is released from the lower mold BM. That is, the diaphragm DF formed in the semiconductor chip CHP1 is easily broken by the deformation of the sealing body at the time of mold releasing. Therefore, the second related technique causes reduction in an yield of the flow sensor due to the breakage of the diaphragm DF, and thus, obviously causes an increase in the manufacturing cost of the flow sensor.

As described above, from the viewpoint of improving the position alignment accuracy at the time of sandwiching the lead frame LF by the upper mold UM and the lower mold BM, the second related technique employs a connection structure in which the positioning hole AHL is formed in the dam bar DM configuring a part of the lead frame LF, and in which the positioning pin APN provided on the lower mold BM is inserted into this positioning hole AHL. Meanwhile, this connection structure becomes interruption when the sealing body is released from the lower mold BM because the lead frame LF and the lower mold BM are firmly fixed to each other. Therefore, a large deformation of the sealing body is caused at the time of mold releasing unless any devisal is made for the mold releasing method by the ejection pin EJPN. Particularly, in the flow sensor, the diaphragm DF formed of the thin plate section which is weak in the deformation is formed in the semiconductor chip CHP1 sealed with the sealing body, and thus, the large deformation of the sealing body at the time of mold releasing leads directly to the breakage of the flow sensor.

Accordingly, in the first embodiment, in order to improve the above-described point, a devisal has been made for the mold releasing method by the ejection pin EJPN on the assumption of the employment of the connection structure in which the positioning hole AHL is formed in the dam bar DM configuring a part of the lead frame LF, and in which the positioning pin APN provided on the lower mold BM is inserted into this positioning hole AHL. Hereinafter, a technical idea in the first embodiment for which this devisal has been made will be described.

<Overview of Feature in First Embodiment>

The first embodiment has a feature that a sealing body is released from a lower mold by thrusting up, from the lower mold, an ejection pin arranged in an outer region of the semiconductor chip so as not to overlap with the semiconductor chip arranged in vicinity of a center part in an arbitrary cross-sectional surface of a flow sensor which is in parallel to a moving direction of a gas flowing on an exposed flow detecting unit formed on the semiconductor chip. Thus, the deformation applied to the sealing body at the time of mold releasing can be smaller than that in a case in which the sealing body is released from the lower mold by arranging the ejection pin in a region overlapping with the semiconductor chip. That is, the deformation of the sealing body can be smaller in employing a configuration in which the vicinity of the periphery (outer edge) of the sealing body is thrust up by the ejection pin than in employing a configuration in which the vicinity of the center part of the sealing body is thrust up by the ejection pin. As a result, the breakage of the diaphragm formed in the semiconductor chip due to the deformation applied to the sealing body can be prevented. In this manner, the yield of the flow sensor can be improved, and thus the manufacturing cost of the flow sensor can be reduced.

More particularly, in the first embodiment, the dam bar is arranged in the outside of the sealing body, and the positioning pin formed in the lower mold is inserted into the positioning hole provided in this dam bar, so that the connection part is formed. This connection part is firmly fixed so that the positioning pin is difficult to be pulled out from the positioning hole, and besides, the connection is difficult to be released therefrom because the upper part of this connection part is covered with the resin. However, the first embodiment employs the configuration in which the vicinity of the periphery (outer edge) of the sealing body is thrust up by the ejection pin. This means that a thrust position by the ejection pin and a position of the connection part get close to each other, and thus, this means that the connection part is easy to be released therefrom, and besides, the deformation of the sealing body having the connection part serving as the fulcrum point which is difficult to be released therefrom can be suppressed. Also from this fact, according to the first embodiment, the breakage of the diaphragm formed in the semiconductor chip due to the large deformation applied to the sealing body can be prevented, and thus, it can be found to obtain such a remarkable effect that the yield of a flow sensor can be improved, which results in the reduction in the manufacturing cost of the flow sensor.

<Mounting Configuration of Flow Sensor According to First Embodiment>

Figure 7A:
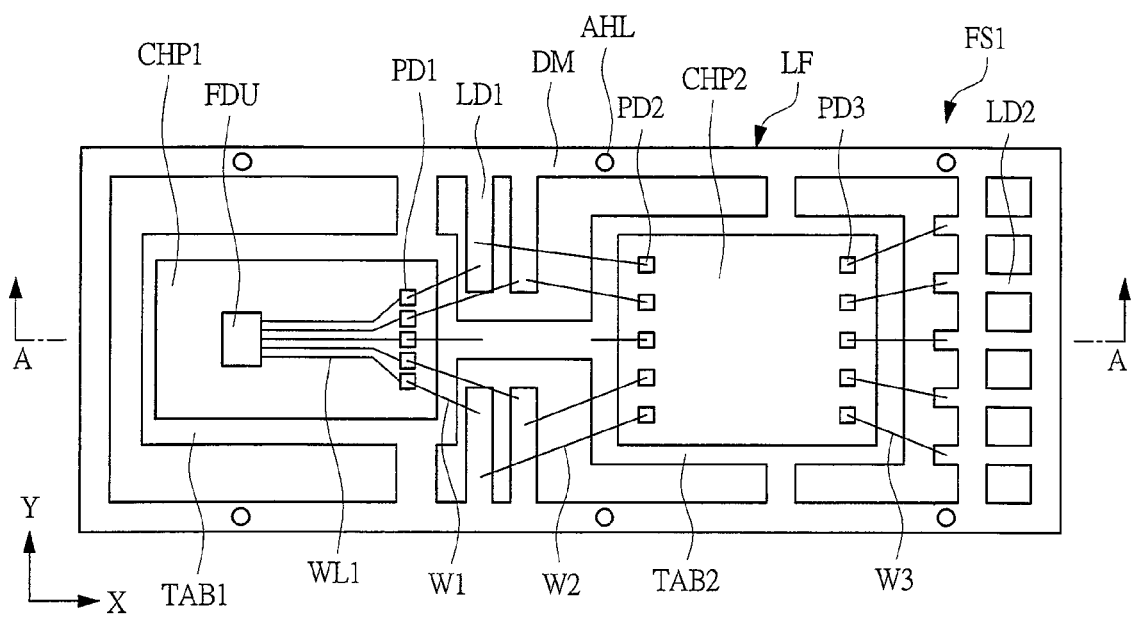
FIG. 7A is a plan view showing a mounting configuration of the flow sensor according to the first embodiment.
Figure 7B:
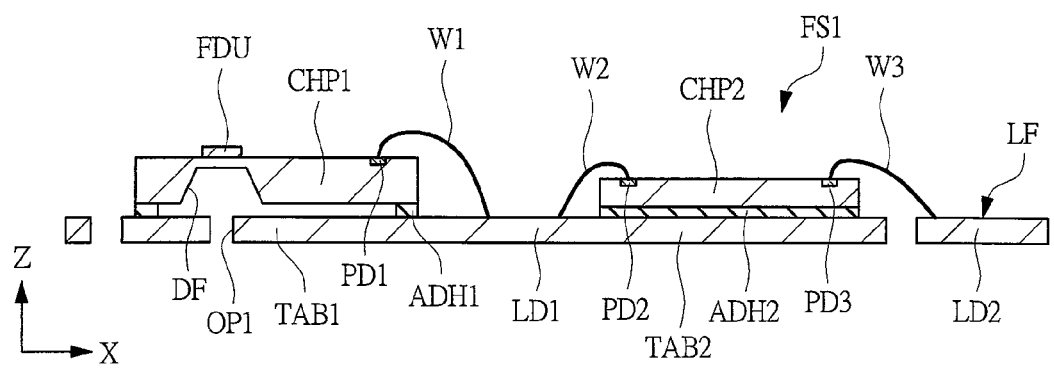
FIG. 7B is a cross-sectional view obtained by cutting FIG. 7A on a line A-A.
Figure 7C:
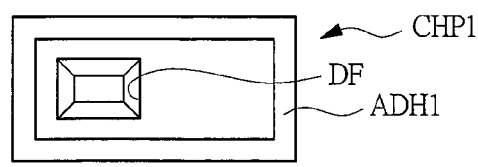
FIG. 7C is a plan view showing a rear surface of the semiconductor chip.

Hereinafter, a mounting configuration of the flow sensor according to the first embodiment will be described. FIGS. 7A to 7C are views each showing the mounting configuration of the flow sensor FS1 according to the first embodiment, which is a view illustrating a configuration before sealing with the resin. Particularly, FIG. 7A is a plan view showing a mounting configuration of the flow sensor FS1 according to the first embodiment. FIG. 7B is a cross-sectional view obtained by cutting FIG. 7A on a line A-A, and FIG. 7C is a plan view showing a rear surface of the semiconductor chip CHP1.

First, as shown in FIG. 7A, the flow sensor FS1 according to the first embodiment has, for example, the lead frame LF made of a copper material. This lead frame LF has the chip mounting section TAB1 and the chip mounting section TAB2 in an inside surrounded by the dam bar DM configuring an outer frame. And, the semiconductor chip CHP1 is mounted on the chip mounting section TAB1, and a semiconductor chip CHP2 is mounted on the chip mounting section TAB2.

The semiconductor chip CHP1 has a rectangular shape, and the flow detecting unit FDU is formed in a substantially center part. Furthermore, a wiring WL1 connected to the flow detecting unit FDU is formed on the semiconductor chip CHP1, and this wiring WL1 is connected to a plurality of pads PD1 formed along one side of the semiconductor chip CHP1. That is, the flow detecting unit FDU and the plurality of pads PD1 are connected by the wiring WL1. These pads PD1 are connected to the lead LD1 formed on the lead frame LF through a wire W1 made of, for example, a gold wire. The lead LD1 formed on the lead frame LF is further connected to the pad PD2 formed on the semiconductor chip CHP2 through a wire W2 made of, for example, a gold wire.

In the semiconductor chip CHP2, an integrated circuit including a semiconductor element such as MISFET (Metal Insulator Semiconductor Field Effect Transistor) and a wiring are formed. Specifically, an integrated circuit configuring a CPU 1, an input circuit 2, an output circuit 3, a memory 4, or others shown in FIG. 1 is formed. These integrated circuits are connected to a pad PD2 and a pad PD3 that function as an external connecting terminal. Furthermore, the pad PD3 formed in the semiconductor chip CHP2 is connected to a lead LD2 formed on the lead frame LF through a wire W3 made of, for example, a gold wire. In this manner, it can be found that the semiconductor chip CHP1 having the flow detecting unit FDU formed thereon and the semiconductor chip CHP2 having the control circuit formed thereon are connected to each other through the lead LD1 formed on the lead frame LF. Here, although not shown in the drawings, a polyimide film may be formed in the outermost surface of the semiconductor chip CHP1 for a purpose of stress relaxation against the bonded resin, surface protection therefrom and insulation therefrom.

Note that the dam bar DM shown in FIG. 7A has a function for preventing resin leakage in a resin-sealing step described later. In the first embodiment, a plurality of positioning holes AHL are formed in the dam bar DM having such a function. These positioning holes AHL are formed for inserting a positioning pin provided in a lower mold described later, and the lead frame LF having the dam bar DM can be securely fixed in the lower mold by inserting the positioning pin into the positioning holes AHL provided in the dam bar DM. Thus, the positioning alignment accuracy at the time of arranging the lead frame LF in the lower mold can be improved.

Furthermore, as shown in FIG. 7B, the chip mounting section TAB1 is formed in the lead frame LF, and the semiconductor chip CHP1 is mounted on this chip mounting section TAB1. This semiconductor chip CHP1 is bonded to the chip mounting section TAB1 by the adhesive ADH1. The diaphragm DF (thin plate section) is formed on the rear surface of the semiconductor chip CHP1, and the flow detecting unit FDU is formed in the front surface of the semiconductor chip CHP1, the front surface facing the diaphragm DF. On the other hand, an opening OP1 is formed in the bottom portion of the chip mounting section TAB1 which exists below the diaphragm DF. Here, an example in which the opening OP1 is formed in the bottom portion of the chip mounting section TAB1 that exists below the diaphragm DF has been described. However, the technical idea in the first embodiment is not limited to this example, and the lead frame LF in which the opening OP1 is not formed can be used.

Moreover, as shown in FIG. 7B, in the front surface (upper surface) of the semiconductor chip CHP1, not only the flow detecting unit FDU but also the pad PD1 connected to the flow detecting unit FDU are formed, and this pad PD1 is connected to the lead LD1 formed in the lead frame LF through the wire W1. Furthermore, the semiconductor chip CHP2 in addition to the semiconductor chip CHP1 is mounted in the lead frame LF, and the semiconductor chip CHP2 is bonded to the chip mounting section TAB2 by an adhesive ADH2. Moreover, the pad PD2 formed in the semiconductor chip CHP2 and the lead LD1 formed in the lead frame LF are connected to each other through the wire W2. In addition, the pad PD3 formed in the semiconductor chip CHP2 and the lead LD2 formed in the lead frame LF are electrically connected to each other through the wire W3.

For the adhesive ADH1 which bonds the semiconductor chip CHP1 with the chip mounting section TAB1 and the adhesive ADH2 which bonds the semiconductor chip CHP2 and the chip mounting section TAB2, for example, an adhesive whose component is a thermosetting resin such as epoxy resin and polyurethane resin, and an adhesive whose component is a thermoplastic resin such as polyimide resin, acrylic resin and fluorine resin may be used.

For example, the semiconductor chip CHP1 and the chip mounting section TAB1 can be bonded to each other by applying the adhesive ADH1 and a silver paste or using a sheet-like adhesive as shown in FIG. 7C. FIG. 7C is a plan view showing the rear surface of the semiconductor chip CHP1. As shown in FIG. 7C, the diaphragm DF is formed in the rear surface of the semiconductor chip CHP1, and the adhesive ADH1 is applied so as to surround this diaphragm DF. Note that FIG. 7C shows an example in which the adhesive ADH1 is applied so as to surround the diaphragm DF in a quadrangular shape. However, the application method is not limited to this, and the adhesive ADH1 may be applied so as to surround the diaphragm DF in, for example, an arbitrary shape such as an elliptical shape.

In the flow sensor FS1 according to in the first embodiment, the mounting configuration of the flow sensor FS1 before sealing by the resin is configured as described above. Hereinafter, the mounting configuration of the flow sensor FS1 after sealing by the resin will be described.

FIGS. 8A to 8C are views each showing the mounting configuration of the flow sensor FS1 according to the first embodiment, each of which illustrates a configuration after sealing by the resin. More particularly, FIG. 8A is a plan view showing the mounting configuration of the flow sensor FS1 according to the first embodiment. FIG. 8B is a cross-sectional view obtained by cutting FIG. 8A on a line A-A, and FIG. 8C is a cross-sectional view obtained by cutting FIG. 8A on a line B-B.

As shown in FIG. 8A, the flow sensor FS1 according to the first embodiment is configured so that a part of the semiconductor chip CHP1 and the entire semiconductor chip CHP2 are covered by the resin MR in a state in which the flow detecting unit FDU formed in the semiconductor chip CHP1 is exposed. That is, in the first embodiment, a pad forming region of the semiconductor chip CHP1 and the entire region of the semiconductor chip CHP2 are collectively covered by the resin MR while exposing a region in which the flow detecting unit FDU is formed.

Here, in the first embodiment, for example, a convex section made of the resin MR may be provided so as to cover the wire W1 which is electrically connected to the pad PD formed in the semiconductor chip CHP1. That is, a convex section can be formed in the resin MR (sealing body) in order to securely seal a component such as a gold wire (wire) having a high loop height. However, as shown in FIG. 8A and FIG. 8B, in the first embodiment, the convex section is not fundamental to the configuration requirements. That is, even if the convex section is not provided, it is not necessary to provide the convex section in the resin MR (sealing body) as long as the gold wire (wire) which electrically connects the pad PD1 formed in the semiconductor chip CHP1 and the lead LD1 can be sealed by the resin MR.

Note that, for example, a thermosetting resin such as epoxy resin and phenol resin and a thermoplastic resin such as polycarbonate and polyethylene terephthalate can be used for the above-described resin MR, and besides, a filler such as glass and mica can be mixed into the resin.

According to the first embodiment, sealing by this resin MR can be performed in a state in which the semiconductor chip CHP1 having the flow detecting unit FDU formed thereon is fixed by a mold, and therefore, a part of the semiconductor chip CHP1 and the semiconductor chip CHP2 can be sealed by the resin MR while suppressing the positional shift of the semiconductor chip CHP1. This means that, in the flow sensor FS1 in the first embodiment, a part of the semiconductor chip CHP1 and the entire region of the semiconductor chip CHP2 can be sealed by the resin MR while suppressing the positional shift of each flow sensor FS1, and means that a variation in the position of the flow detecting unit FDU formed in the semiconductor chip CHP1 can be suppressed.

As a result, according to the first embodiment, the positions of the flow detecting units FDU for detecting the flow rate of the gas can be consistent with each other in the respective flow sensors FS1, and therefore, a remarkable effect capable of suppressing the variation in performance for detecting the gas flow rate in each flow sensor FS1 can be obtained.

In order to prevent the resin MR from entering the internal space of the diaphragm DF, note that the first embodiment has an assumption on a configuration in which, for example, the adhesive ADH1 is applied so as to surround the diaphragm DF formed in the rear surface of the semiconductor chip CHP1. Furthermore, as shown in FIG. 8B and FIG. 8C, the opening OP1 is formed in the bottom portion of the chip mounting section TAB1 which is below the diaphragm DF formed in the rear surface of the semiconductor chip CHP1, and further, an opening OP2 is provided in the resin MR which covers the rear surface of the chip mounting section TAB1.

Thus, according to the flow sensor FS1 in the first embodiment, the internal space of the diaphragm DF communicates with an external space of the flow sensor FS1 through the opening OP1 formed in the bottom portion of the chip mounting section TAB1 and the opening OP2 formed in the resin MR. As a result, a pressure of the internal space of the diaphragm DF and a pressure of the external space of the flow sensor FS1 can be equalized to each other, and thus a stress applied onto the diaphragm DF can be suppressed.

Moreover, in the first embodiment, the upper surface SUR (MR) of the resin MR is higher than the upper surface SUR (CHP) of the semiconductor chip CHP1. That is, in the first embodiment, the height of the upper surface SUR (MR) of the resin MR (sealing body) is higher than the height of the upper surface SUR (CHP) of the semiconductor chip CHP1 including the flow detecting unit FDU in a cross-sectional surface in a direction in parallel to air flow. In this manner, the flow of the air flowing on the flow detecting unit FDU can be stabilized, and thus, the flow detecting accuracy in the flow detecting unit FDU can be improved.

Moreover, the flow sensor FS1 according to the first embodiment has such a shape as partially covering an upper part of the semiconductor chip CHP1 by the resin MR in a cross-sectional surface in a direction in (Y direction) parallel to the air flow. For this reason, a contact area between the semiconductor chip CHP1 and the resin MR in the cross-sectional surface in the direction in parallel to the air flow increases, and thus peeing off at a boundary between the semiconductor chip CHP1 and the resin MR can be prevented.

As described above, the flow sensor FS1 according to the first embodiment has the above-described features, and therefore, a problem of occurrence of large breakage due to growth of cracks from the peeled part can be avoided, and besides, air flow turbulence on the flow detecting unit FDU can be suppressed. As a result, accuracy of correct measurement of the air flow rate in the flow detecting unit FDU can be improved.

Here, the first embodiment has such a feature as employing the configuration in which the vicinity of the periphery (outer edge) of the sealing body is thrust up by the ejection pin. For this reason, in the flow sensor FS1 which is the final product, a trace of the configuration in which the vicinity of the periphery (outer edge) of the sealing body is thrust up by the ejection pin remains. Specifically, as shown in FIG. 8C, a trace caused by the ejection pin remains in an ejector area EJA which is an outer region of the semiconductor chip CHP1 so as not to overlap with the semiconductor chip CHP1 in the thickness direction of the sealing body. In other words, the trace caused by the ejection pin remains in the ejector area EJA which is an outer region of the chip mounting section TAB1 so as not to overlap with the chip mounting section TAB1. A specific shape of this trace will be described later.

As described above, the flow sensor FS1 according to the first embodiment has the mounting configuration. In a practical flow sensor FS1, the dam bar DM configuring the outer frame of the lead frame LF is removed after sealing by the resin MR. FIG. 8A shows the mounting configuration of the flow sensor FS1 after removing the dam bar DM. As shown in FIG. 8A, it can be found that a plurality of electrical signals can be independently taken from a plurality of leads LD2 by cutting the dam bar DM.

Figure 9:
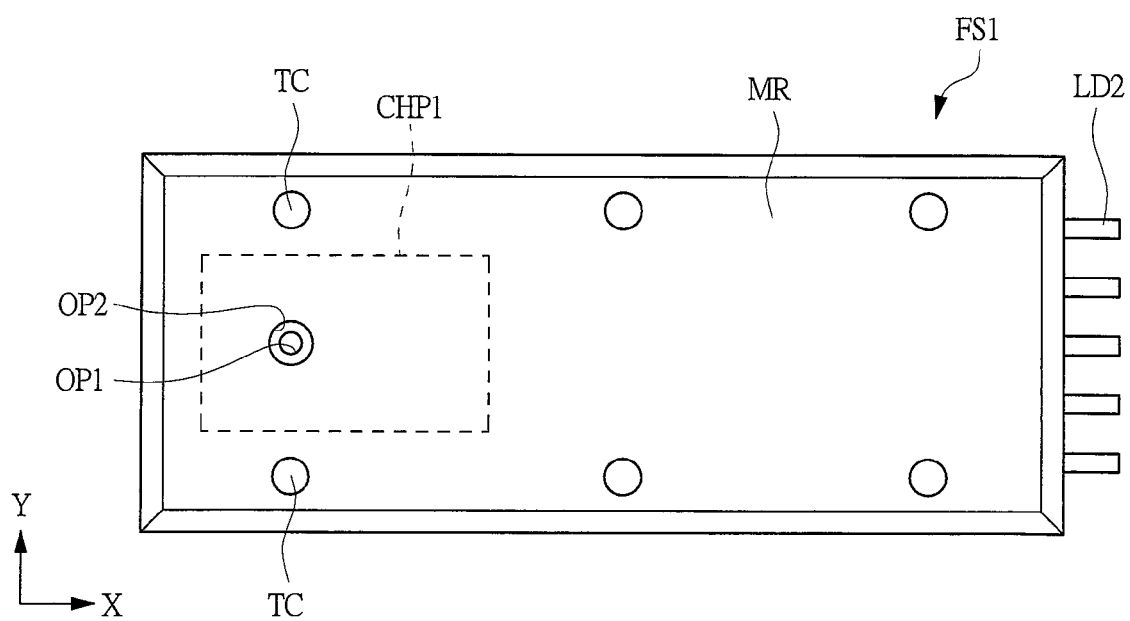
FIG. 9 is a plan view obtained by viewing the flow sensor according to the first embodiment from the rear surface side.

FIG. 9 is a plan view showing the flow sensor FS1 according to the first embodiment from the rear surface side. As shown in FIG. 9, the flow sensor FS1 according to the first embodiment has the sealing body having a rectangular shape made of the resin MR, and a plurality of leads LD2 protrude from this resin MR. Furthermore, the semiconductor chip CHP1 is embedded in the inside of the sealing body made of the resin MR as shown with the dashed line in FIG. 9, and the opening OP1 and the opening OP2 which communicate with the diaphragm formed on this semiconductor chip CHP1 are formed. The opening OP1 is provided on the chip mounting section on which the semiconductor chip CHP1 is mounted, and the opening OP2 is provided on the resin MR which configures the sealing body. As can be seen from FIG. 9, a diameter of the opening OP2 is larger than a diameter of the opening OP1.

Furthermore, as shown in FIG. 9, a plurality of traces TC caused by the ejection pin remain in the rear surface of the sealing body which configures the flow sensor FS1. Specifically, as shown in FIG. 9, it can be found that a plurality of traces TC are arranged at the same intervals as each other along a long side direction (X direction) which configures a part of the outer edge of the sealing body. On the other hand, when a short side direction (Y direction) (a direction in parallel to the gas flowing direction) which configures a part of the outer edge of the sealing body is focused, it can be found that a trace TC is formed in the outer region of the semiconductor chip CHP1 so as not to overlap with the semiconductor chip CHP1 when seen in a plan view. In other words, when seen in a plan view, it can be found that the trace TC is formed in a region sandwiched by the semiconductor chip CHP1 and the outer edge region of the sealing body. Therefore, in the flow sensor FS1 according to the first embodiment, the trace TC caused by the ejection pin in the mold releasing step performed after the resin-sealing step remains, and therefore, it can be specified at which position of the sealing body the ejection pin has been pressed in the mold releasing step after the resin-sealing step by checking the rear surface of the flow sensor FS1 which is the final product. This means that it can be determined whether or not the sensor is a product which has been subjected to the mold releasing step that is the feature of the first embodiment by checking the flow sensor FS1 which is the final product.

<Method for Manufacturing Flow Sensor According to First Embodiment>

Hereinafter, a method for manufacturing the flow sensor FS1 which is the feature in the first embodiment will be described with reference to the drawings. First, with the use of the cross-sectional view obtained by cutting FIG. 8A on the line A-A, the method is described in the viewpoint of defining that the flow sensor FS1 of this embodiment has a two-chip structure having the semiconductor chip CHP1 and the semiconductor chip CHP2 (FIG. 10 to FIG. 13). Then, with the use of a cross-sectional view obtained by cutting FIG. 8A on the line B-B, the method is described in the viewpoint of defining a feature process in the first embodiment (FIG. 14 to FIG. 17).

Figure 10:
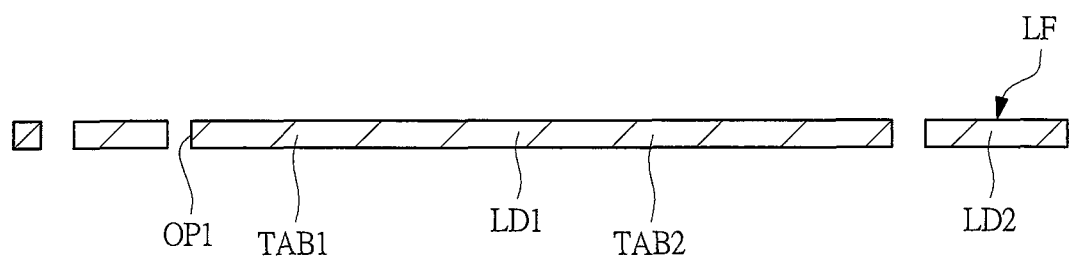
FIG. 10 is a cross-sectional view showing a manufacturing step of the flow sensor according to the first embodiment.

First, as shown in FIG. 10, for example, the lead frame LF made of a copper material is prepared. In this lead frame LF, the chip mounting section TAB1, the chip mounting section TAB2, the lead LD1 and lead LD2 are integrally formed with each other, and the opening OP1 is formed in the bottom portion of the chip mounting section TAB1.

Figure 11:
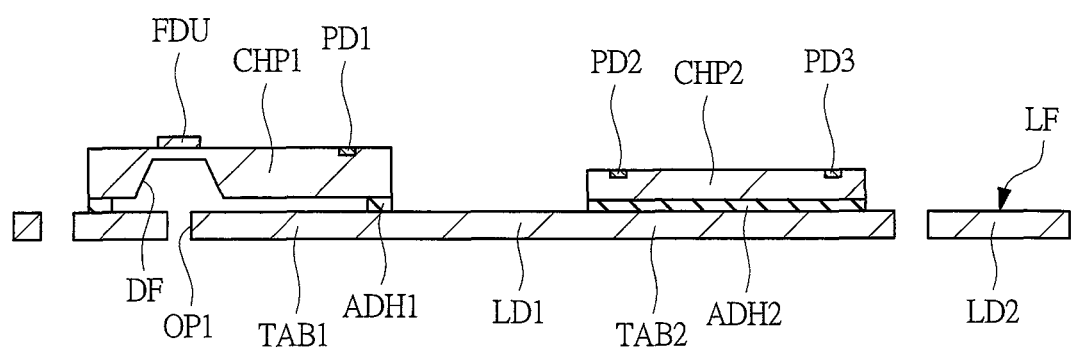
FIG. 11 is a cross-sectional view showing the manufacturing step of the flow sensor continued from FIG. 10.

Subsequently, as shown in FIG. 11, the semiconductor chip CHP1 is mounted on the chip mounting section TAB1, and the semiconductor chip CHP2 is mounted on the chip mounting section TAB2. Specifically, the semiconductor chip CHP1 is connected onto the chip mounting section TAB1 formed in the lead frame LF by an adhesive ADH1. At this time, the semiconductor chip CHP1 is mounted on the chip mounting section TAB1 so that the diaphragm DF formed in the semiconductor chip CHP1 communicates with the opening OP1 formed in the bottom portion of the chip mounting section TAB1.

Note that the flow detecting unit FDU, a wiring (not shown) and the pad PD1 are formed in the semiconductor chip CHP1 by a normal semiconductor manufacturing process. Furthermore, for example, by anisotropic etching, the diaphragm DF is formed at such a position on the rear surface of the semiconductor chip CHP1 as facing the flow detecting unit FDU formed on the front surface thereof. In addition, the semiconductor chip CHP2 is also mounted on the chip mounting section TAB2 formed on the lead frame LF by the adhesive ADH2. In this semiconductor chip CHP2, a semiconductor element such as a MISFET (not shown), a wiring (not shown), the pad PD2 and pad PD3 are previously formed by a normal semiconductor manufacturing process.

Figure 12:
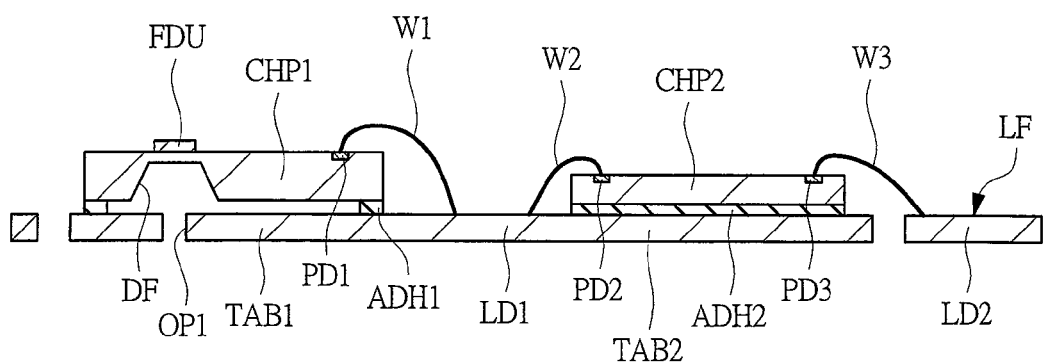
FIG. 12 is a cross-sectional view showing the manufacturing step of the flow sensor continued from FIG. 11.

Next, as shown in FIG. 12, the pad PD1 formed in the semiconductor chip CHP1 and the lead LD1 formed in the lead frame LF are connected to each other by the wire W1 (wire bonding). Similarly, the pad PD2 formed in the semiconductor chip CHP2 and the lead LD1 are connected to each other by the wire W2, and the pad PD3 formed in the semiconductor chip CHP2 and the lead LD2 are connected to each other by the wire W3. Each of the wires W1 to W3 is made of, for example, a gold wire.

Figure 13:
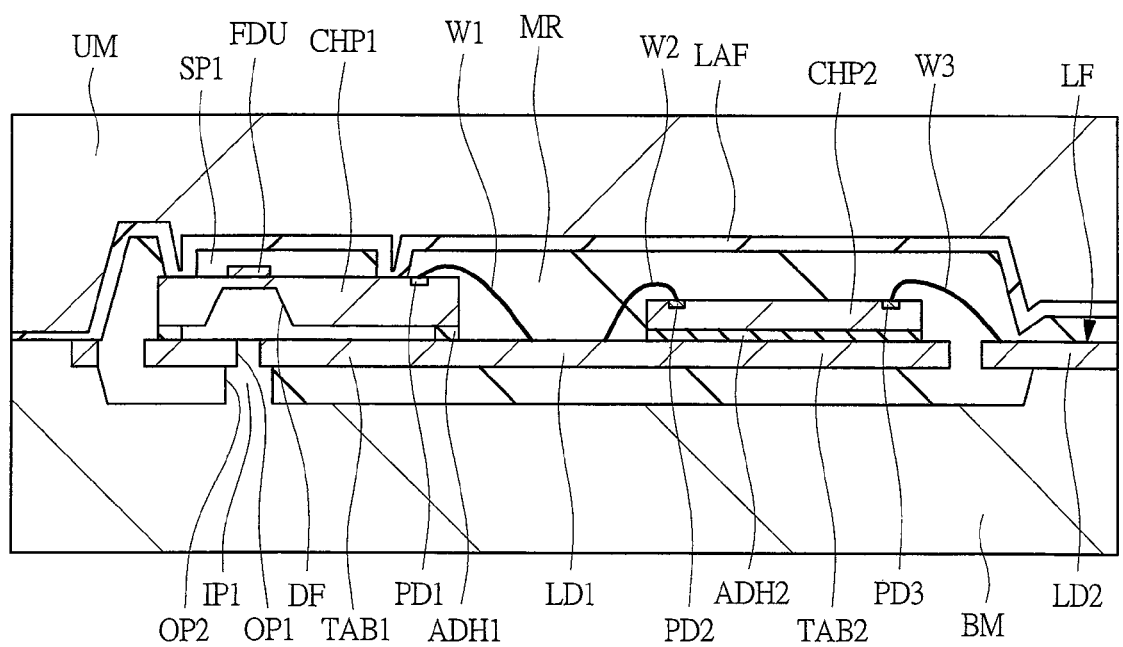
FIG. 13 is a cross-sectional view showing the manufacturing step of the flow sensor continued from FIG. 12.

Afterwards, as shown in FIG. 13, the front surface of the semiconductor chip CHP1 except for the flow detecting unit FDU and its vicinity, the wire W1, the lead LD1, the wire W2, the entire main surface of the semiconductor chip CHP2, a part of the lead LD2 and the wire W3 are sealed by the resin MR (molding process). Specifically, as shown in FIG. 13, the lead frame LF on which the semiconductor chip CHP1 and the semiconductor chip CHP2 are mounted are sandwiched by the upper mold UM and the lower mold BM through the second space (enclosed space). Afterwards, under heating, by casting the resin MR into this second space (enclosed space), the front surface of the semiconductor chip CHP1 except for the flow detecting unit FDU and its vicinity, the wire W1, the lead LD1, the wire W2, the entire main surface of the semiconductor chip CHP2, a part of the lead LD2 and the wire W3 are sealed by the resin MR.

At this time, as shown in FIG. 13, the internal space of the diaphragm DF is isolated from the above-described first space by the adhesive ADH1, and thus, also in filling the first space with the resin MR, the resin MR can be prevented from entering the internal space of the diaphragm DF.

Moreover, in the first embodiment, the sealing can be performed in a state in which the semiconductor chip CHP1 having the flow detecting unit FDU formed thereon is fixed by a mold, and therefore, a part of the semiconductor chip CHP1 and the semiconductor chip CHP2 can be sealed by the resin MR while suppressing the positional shift of the semiconductor chip CHP1. This means that apart of the semiconductor chip CHP1 and the entire region of the semiconductor chip CHP2 can be sealed by the resin MR while suppressing the positional shift of each flow sensor according to a method for manufacturing the flow sensor in the first embodiment, and means that a variation in the position of the flow detecting unit FDU formed in the semiconductor chip CHP1 can be suppressed. As a result, according to the first embodiment, the position of the flow detecting unit FDU for detecting the flow rate of a gas can be equalized among the flow sensors, and therefore, a remarkable effect capable of suppressing the variation in performance for detecting the gas flow rate in each flow sensor can be obtained.

Here, in the method for manufacturing the flow sensor according to the first embodiment, the lead frame LF on which the semiconductor chip CHP1 has been mounted is sandwiched by the lower mold BM and the upper mold UM so that the flow detecting unit FDU formed in the semiconductor chip CHP1 is surrounded by the first space SP1 isolated from the second space. Thus, according to the first embodiment, the flow detecting unit FDU formed in the semiconductor chip CHP1 and its vicinity region are exposed, and at the same time, other surface region of the semiconductor chip CHP1 can be sealed.

Moreover, in the method for manufacturing the flow sensor according to the first embodiment, when the lead frame LF on which the semiconductor chip CHP1 has been mounted is sandwiched by the upper mold UM and the lower mold BM, the elastic body film LAF is interposed between the lead frame LF on which the semiconductor chip CHP1 has been mounted and the upper mold UM. For example, each semiconductor chip CHP1 has dimensional variation in the thickness. Therefore, in a case in which the thickness of the semiconductor chip CHP1 is thinner than an average thickness, a gap is caused when the lead frame LF on which the semiconductor chip CHP1 has been mounted is sandwiched by the upper mold UM and the lower mold BM, and the resin MR leaked from this gap onto the semiconductor chip CHP1. On the other hand, in a case in which the thickness of the semiconductor chip CHP1 is thicker than the average thickness, a force applied to the semiconductor chip CHP1 becomes large when the lead frame LF on which the semiconductor chip CHP1 has been mounted is sandwiched by the upper mold UM and the lower mold BM, and there is a risk of breakage of the semiconductor chip CHP1.

Accordingly, in the first embodiment, in order to prevent the above-described resin leakage onto the semiconductor chip CHP1 due to the thickness variation of the semiconductor chip CHP1 or the breakage of the semiconductor chip CHP1, the elastic body film LAF is interposed between the lead frame LF on which the semiconductor chip CHP1 has been mounted and the upper mold UM. Thus, for example, in the case in which the thickness of the semiconductor chip CHP1 is thinner than the average thickness, the gap is caused when the lead frame LF on which the semiconductor chip CHP1 has been mounted is sandwiched by the upper mold UM and the lower mold BM. However, this gap can be filled with the elastic body film LAF, and thus the resin leakage onto the semiconductor chip CHP1 can be prevented. On the other hand, in the case in which the thickness of the semiconductor chip CHP1 is thicker than the average thickness, a dimension the elastic body film LAF in the thickness direction changes so as to absorb the thickness of the semiconductor chip CHP1 when the lead frame LF on which the semiconductor chip CHP1 has been mounted is sandwiched by the upper mold UM and the lower mold BM since the elastic body film LAF is soft. Thus, even if the thickness of the semiconductor chip CHP1 is thicker than the average thickness, application of a force more than required to the semiconductor chip CHP1 can be prevented, and as a result, the breakage of the semiconductor chip CHP1 can be prevented.

Note that, for example, a polymer material such as Teflon (registered trademark) and fluorine resin can be used as the above-described elastic body film LAF.

Subsequently, as shown in FIG. 13, in the first embodiment, the resin MR is casted also into the rear surface side of the lead frame LF as well. Therefore, the opening OP1 is formed in the bottom portion of the chip mounting section TAB1, and therefore, it is concerned that the resin MR is flowed from this opening OP1 into the internal space of the diaphragm DF. Accordingly, in the first embodiment, the shape of the lower mold BM for sandwiching the lead frame LF is devised. Specifically, as shown in FIG. 13, a protruding insert piece (die) IP1 is formed in the lower mold BM, and the protruding insert piece IP1 formed in the lower mold BM is configured so as to be inserted into the opening OP1 formed in the bottom portion of the chip mounting section TAB1 when the lead frame LF is sandwiched by the upper mold UM and the lower mold BM. Thus, the insert piece IP1 is inserted into the opening OP1 without a gap, and thus the resin MR can be prevented from entering the internal space of the diaphragm DF from the opening OP1. That is, in the first embodiment, the protruding insert piece IP1 is formed in the lower mold BM, and this insert piece IP1 is inserted into the opening OP1 formed in the bottom portion of the chip mounting section TAB1 in the resin sealing.

Moreover, in the first embodiment, a shape of the insert piece IP1 is devised. Specifically, in the first embodiment, the insert piece IP1 includes an inserting section inserted into the opening OP1 and a base seat section for supporting this inserting section, and a cross-sectional area of the base seat section is larger than a cross-sectional area of the inserting section. Thus, the insert piece IP1 is configured so as to have a step section provided between the inserting section and the base seat section, and this step section is in closely contact with a bottom surface of the chip mounting section TAB1.

By configuring the insert piece IP1 in this manner, the following effect can be obtained. For example, in a case in which the shape of the insert piece IP1 is formed of only the above-described inserting section, a diameter of the inserting section of the insert piece IP1 is slightly smaller than a diameter of the opening OP1 since the inserting section is inserted into the opening OP1. Therefore, in the case in which the insert piece IP1 is formed of only the inserting section, even when the inserting section of the insert piece IP1 is inserted into the opening OP1, it is considered that a small gap is caused between the inserted inserting section and the opening OP1. In this case, there is a risk that the resin MR enters the internal space of the diaphragm DF from the gap.

Accordingly, in the first embodiment, the insert piece IP1 is configured so that the inserting section is formed on the base seat section having a cross-sectional area larger than that of the inserting section. In this case, as shown in FIG. 13, the inserting section of the insert piece IP1 is inserted into the opening OP1, and besides, the base seat section of the insert piece IP1 is in closely contact with the bottom surface of the chip mounting section TAB1. As a result, even if a small gap is caused between the inserting section of the insert piece IP1 and opening OP1, the resin MR can be prevented from entering the opening OP1 since the base seat section is firmly pressed onto the rear surface of the chip mounting section TAB1. That is, in the first embodiment, the insert piece IP1 is configured so that the inserting section is formed on the base seat section having a cross-sectional area larger than that of the inserting section, and therefore, the entering of the resin MR into the internal space of the diaphragm DF through the opening OP1 can be effectively prevented because of the combination of a point that the resin MR does not reach the opening OP1 because of the base seat section and a point that the step section formed between the base seat section and the inserting section is pressed onto the chip mounting section TAB1.

Afterwards, at a stage when the resin MR is hardened, the lead frame LF on which the semiconductor chip CHP1 and the semiconductor chip CHP2 are mounted is removed from the upper mold UM and the lower mold BM. Thus, the flow sensor FS1 according to the first embodiment can be manufactured. In the flow sensor FS1 manufactured at this time, for example, the opening OP1 is formed in the bottom surface of the chip mounting section TAB1, and the opening OP2 communicated with this opening OP1 is formed in the resin MR as shown in FIG. 8B, as a result of the use of the lower mold BM having the insert piece IP1 formed in the resin-sealing step. This opening OP2 is generated as the result of forming the base seat section in the insert piece IP1, and the cross-sectional area of this opening OP2 is larger than the cross-sectional area of the opening OP1. Thus, according to the flow sensor FS1 in the first embodiment, the internal space of the diaphragm DF communicates with the external space of the flow sensor FS1 through the opening OP1 formed in the bottom portion of the chip mounting section TAB1 and the opening OP2 formed in the resin MR. As a result, the pressure of the internal space of the diaphragm DF and the pressure of the external space of the flow sensor FS1 can be equalized to each other, and thus a stress applied onto the diaphragm DF can be suppressed.

Next, in the viewpoint of defining a feature process in the first embodiment, a manufacturing step of the flow sensor FS1 will be described (FIG. 14 to FIG. 17).

Figure 14:
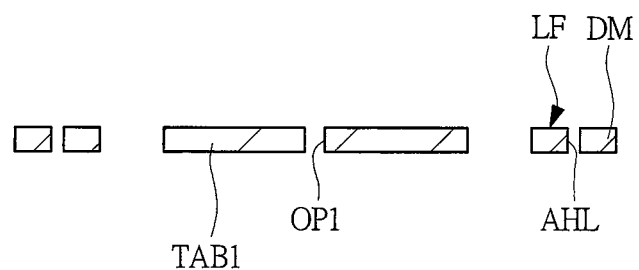
FIG. 14 is a cross-sectional view showing a manufacturing step of the flow sensor according to the first embodiment.

First, as shown in FIG. 14, for example, the lead frame LF made of a copper material is prepared. The chip mounting section TAB1 is formed in this lead frame LF, and the opening OP1 is formed in the bottom portion of the chip mounting section TAB1. In addition, the dam bar DM is formed in the lead frame LF, and the positioning hole AHL is formed in this dam bar DM.

Figure 15:
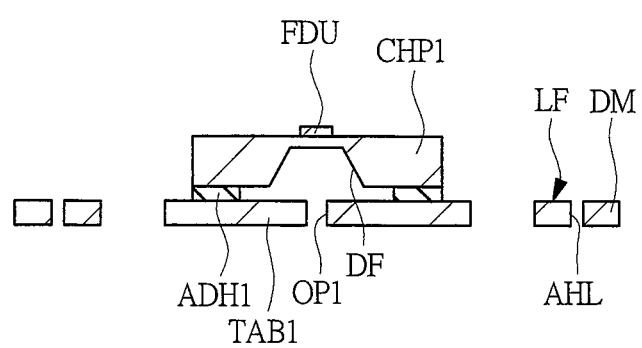
FIG. 15 is a cross-sectional view showing the manufacturing step of the flow sensor continued from FIG. 14.

Subsequently, as shown in FIG. 15, the semiconductor chip CHP1 is mounted on the chip mounting section TAB1. Specifically, the semiconductor chip CHP1 is connected onto the chip mounting section TAB1 formed in the lead frame LF by an adhesive ADH1. At this time, the semiconductor chip CHP1 is mounted on the chip mounting section TAB1 so that the diaphragm DF formed in the semiconductor chip CHP1 communicates with the opening OP1 formed in the bottom portion of the chip mounting section TAB1.

Note that the flow detecting unit FDU, a wiring (not shown) and a pad (not shown) are formed in the semiconductor chip CHP1 by a normal semiconductor manufacturing process. Furthermore, for example, by anisotropic etching, the diaphragm DF is formed at such a position on the rear surface of the semiconductor chip CHP1 as facing the flow detecting unit FDU formed on the front surface.

Afterwards, although not shown in the drawings, a pad formed in the semiconductor chip CHP1 and a lead formed in the lead frame LF are connected to each other by a wire (wire bonding). This wire is formed of, for example, a gold wire.

Figure 16:
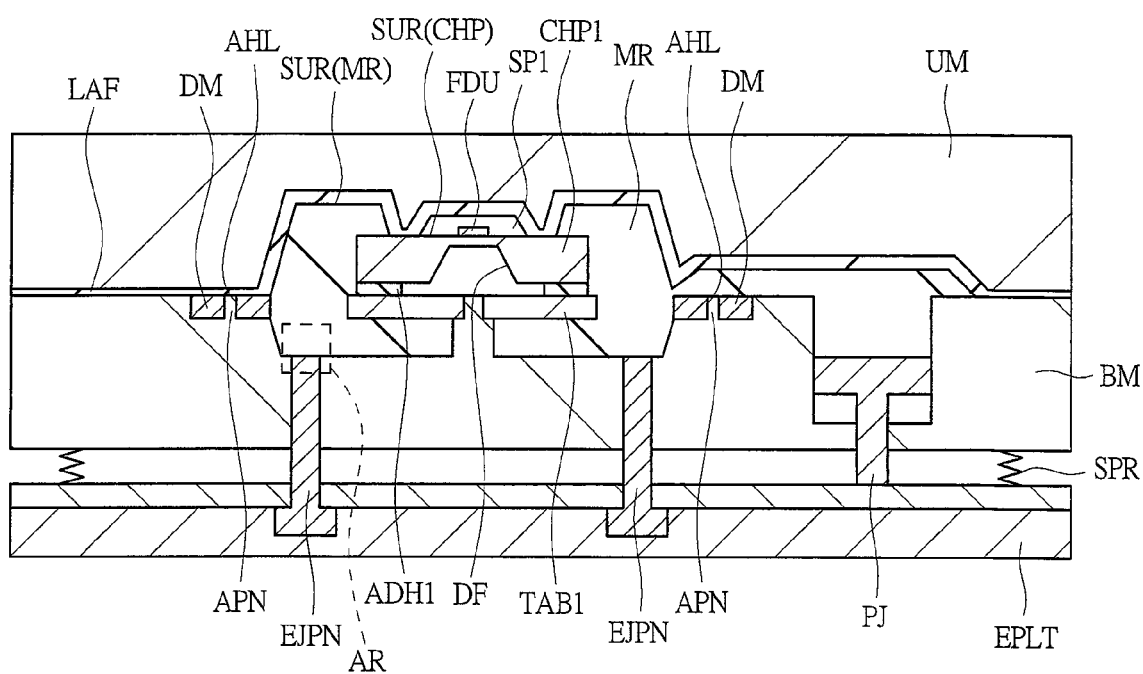
FIG. 16 is a cross-sectional view showing the manufacturing step of the flow sensor continued from FIG. 15.

Next, as shown in FIG. 16, the side surface of the semiconductor chip CHP1 is sealed by the resin MR (molding process). That is, a part of the semiconductor chip CHP1 is sealed by the resin MR (sealing body) while exposing the flow detecting unit FDU formed in the semiconductor chip CHP1.

Specifically, first, the upper mold UM on which the elastic body film LAF is adhered and the lower mold BM into which the ejection pin EJPN is inserted are prepared.

Next, a part of the upper mold UM is in closely contact with the upper surface of the semiconductor chip CHP1 through the elastic body film LAF, and the lead frame LF on which the semiconductor chip CHP1 has been mounted is sandwiched by the upper mold UM and the lower mold BM through the second space while forming the first space SP1 between the upper mold UM and the semiconductor chip CHP1 so as to surround the flow detecting unit FDU. At this time, while the positioning hole AHL is formed in the dam bar DM configuring a part of the lead frame LF, the positioning pin APN is formed in the lower mold BM. Furthermore, the lead frame LF is firmly fixed to the lower mold BM so that the positioning pin APN is inserted into the positioning hole AHL formed in the dam bar DM. For this reason, according to the first embodiment, the accuracy of the positioning alignment at the time of arranging the lead frame LF in the lower mold BM can be improved.

Afterwards, under heating, the resin MR is casted into the second space by the plunger PJ. At this time, as shown in FIG. 16, the ejection pin EJPN is inserted into the lower mold BM. This ejection pin EJPN is configured so as to be able to move up and down by the ejection pin plate EPLT, and the ejection pin plate EPLT is configured so as to be able to move in an up-and-down direction by a pressurization mechanism and the spring SPR of a molding equipment.

Figure 17:
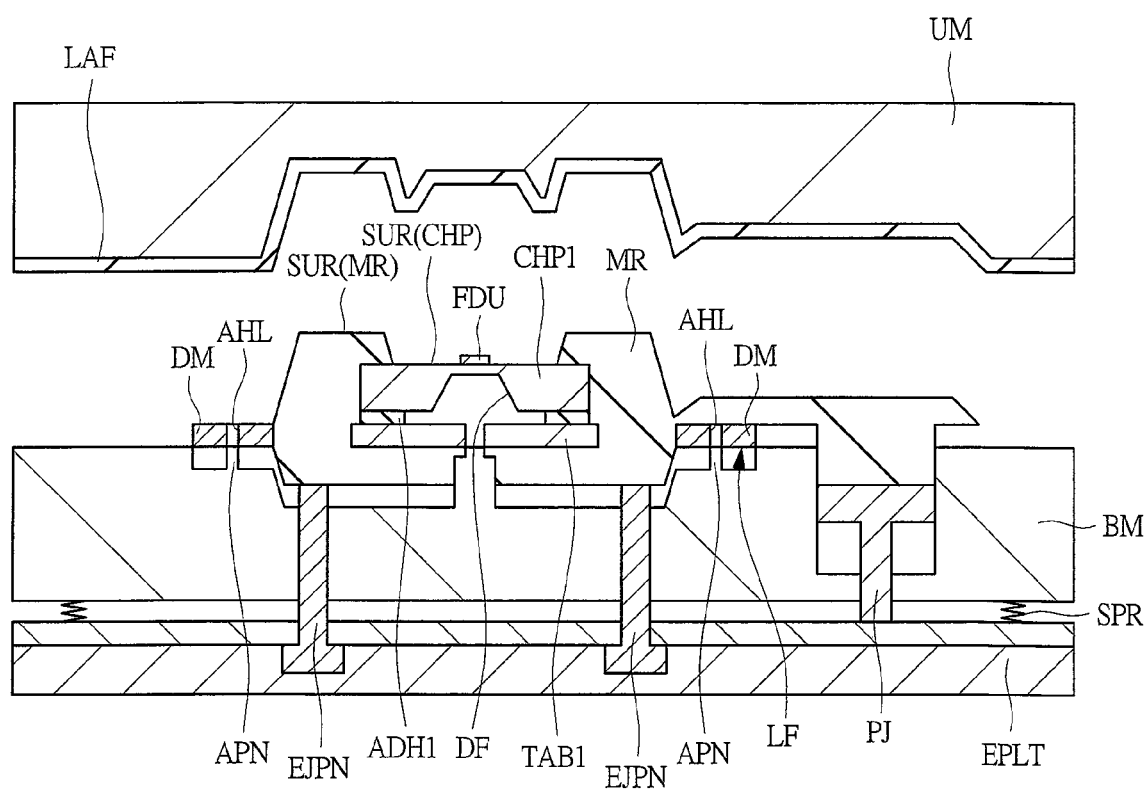
FIG. 17 is a cross-sectional view showing the manufacturing step of the flow sensor continued from FIG. 16.

Subsequently, as shown in FIG. 17, at a stage when the resin MR is hardened, the lead frame LF on which the semiconductor chip CHP1 has been mounted is removed from the upper mold UM and the lower mold BM. Specifically, first, after the upper mold UM is removed from the sealing body containing resin MR, the ejection pin plate EPLT is moved upward by the pressurization mechanism and spring SPR of the molding equipment. Thus, the ejection pin EJPN connected to the ejection pin plate EPLT also moves upward. As a result, the sealing body which has sealed a part of the semiconductor chip CHP1 is released from the lower mold BM by the thrusting by the ejection pin EJPN moved upward.

Here, the feature in the first embodiment is that, in an arbitrary cross-sectional surface of the flowing sensor FS1 which is in parallel to the moving direction of the gas flowing on the flow detecting unit FDU that is formed in the semiconductor chip CHP1, the sealing body is released from the lower mold BM, by thrusting up, from the lower mold BM, the ejection pin EJPN arranged in the outer region of the semiconductor chip CHP1 so as not to overlap with the semiconductor chip CHP1 arranged in the vicinity of the center part. In other words, the ejection pin EJPN is arranged in the outer region of the semiconductor chip CHP1 which is also the internal region of the dam bar DM in the arbitrary cross-sectional surface which is in parallel to the moving direction of the gas flowing on the exposed flow detecting unit FDU. In still other words, the ejection pin EJPN can be provided between one end of the semiconductor chip CHP1 and an external wall of the sealing body (resin MR).

This manner can be smaller in the deformation applied to the sealing body at the time of mold releasing than the case in which the sealing body is released from the lower mold BM by arranging the ejection pin EJPN in the region overlapping with the semiconductor chip CHP1. That is, the deformation of the sealing body can be smaller in employing the configuration in which the vicinity of the periphery (outer edge) of the sealing body is thrust up by the ejection pin EJPN than the configuration in which the vicinity of the center part of the sealing body is thrust up by the ejection pin EJPN. As a result, the diaphragm formed in the semiconductor chip can be prevented from being broken by the deformation applied to the sealing body. In this manner, the yield of the flow sensor can be improved, and thus the manufacturing cost of the flow sensor can be reduced. Particularly, according to the first embodiment, a position of the ejection pin EJPN is arranged at a position not overlapping with the semiconductor chip CHP1 in a plane, and thus application of a load more than required applied to the diaphragm DF formed in the semiconductor chip CHP1 can be suppressed.

Moreover, the dam bar DM is arranged in the outside of the sealing body, and the positioning pin APN formed in the lower mold BM is inserted into the positioning hole AHL provided in this dam bar DM so as to form a connection part. This connection part is firmly fixed so that the positioning pin APN is difficult to be pulled out from the positioning hole AHL, and besides, the connection part is difficult to be released because the upper part of this connection part is covered by the resin MR. With regard to this feature, in the first embodiment, the configuration in which the vicinity of the periphery (outer edge) of the sealing body is thrust up by the ejection pin EJPN is employed. That is, in the first embodiment, the position of the ejection pin EJPN is arranged at a position close to the connection part at which the positioning pin APN is inserted into the positioning hole AHL, and therefore, the positioning pin APN can be easily released from the positioning hole AHL at this connection part. That is, this means that, in the first embodiment, the thrusting-up position by the ejection pin EJPN and the position of the connection part get closer to each other, and thus, the connection part is easily released, and besides, the deformation of the sealing body having the connection section to be the fulcrum point which is difficult to be released can also be suppressed. Also for this reason, according to the first embodiment, the breakage of the diaphragm formed in the semiconductor chip due to the large deformation applied to the sealing body can be prevented. In this manner, it can be found that such a remarkable effect as improvement in the yield of the flow sensor and thus the reduction in the manufacturing cost of the flow sensor can be obtained.

For the reasons described above, the first embodiment employs the configuration in which the sealing body is released from the lower mold BM by thrusting up, from the lower mold BM, the ejection pin EJPN arranged in the outer region of the semiconductor chip CHP1 so as not overlap with the semiconductor chip CHP1 arranged in the vicinity of the center part. As a result, according to the first embodiment, the breakage of the flow sensor at the time of mold releasing can be effectively prevented by a synergistic effect of a point (1) that the load more than required is not applied to the semiconductor chip CHP1 and the diaphragm DF which results in the small deformation because the position of the ejection pin EJPN does not overlap with the semiconductor chip CHP1 and the diaphragm DF, and a point (2) that the mold releasing at the connection part becomes easy because the position of the ejection pin EJPN gets closer to the connection part at which the positioning pin APN is inserted into the positioning hole AHL.

Note that the upper mold UM and the lower mold BM heated at a high temperature of 80° C. or higher are used in the resin-sealing step (molding process) in the first embodiment, and therefore, the heat is conducted in a short period of time from the heated upper mold UM and lower mold BM to the resin MR injected into the second space. As a result, according to the method for manufacturing the flow sensor FS1 in the first embodiment, the heating/hardening time of the resin MR can be shortened.

For example, as described in the section "PROBLEMS TO BE SOLVED BY THE INVENTION", when the gold wire (wire) is fixed by only the potting resin, the potting resin is not accelerated in the hardening by heating, and therefore, the time for hardening the potting resin takes long time, and a problem of decrease in the throughput in the manufacturing step of the flow sensor becomes obvious.

On the other hand, as described above, the heated upper mold UM and lower mold BM are used in the resin-sealing step in the first embodiment, and thus, the heat can be conducted in a short period of time from the heated upper mold UM and lower mold BM to the resin MR, and the heating/hardening time of the resin MR can be shortened. As a result, according to the first embodiment, the throughput in the manufacturing step of the flow sensor FS1 can be improved. In the manner described above, the flow sensor FS1 according to the first embodiment can be manufactured.

Figure 18:
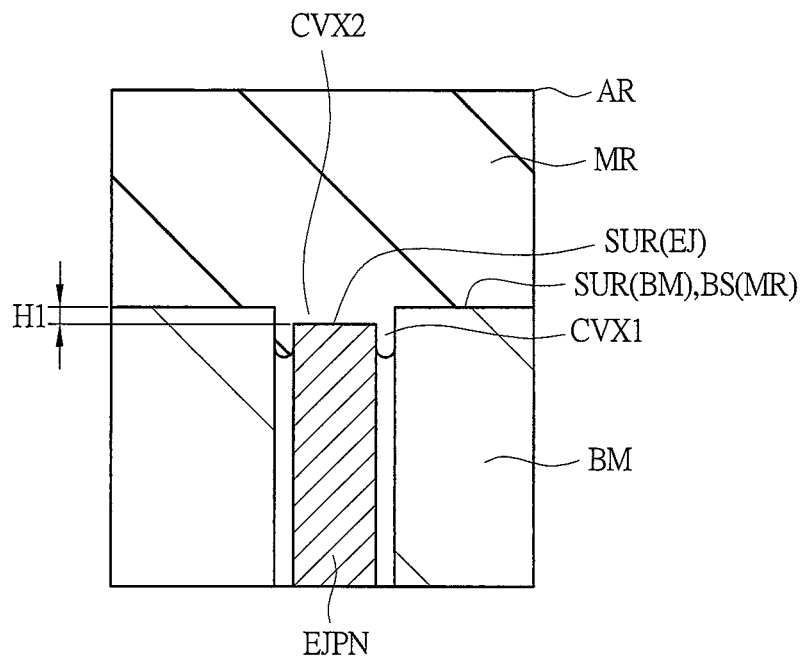
FIG. 18 is a view showing one example of an enlarged view of a region in FIG. 16.

Here, FIG. 18 is a view showing one example of an enlarged view of an area AR in FIG. 16. As shown in FIG. 18, the ejection pin EJPN is inserted into an insertion hole provided in the lower mold BM, and a gap is caused between the insertion hole and the ejection pin EJPN so that the ejection pin EJPN can move up and down inside this insertion hole. For this reason, when the resin MR is casted into the enclosed space, the resin MR also enters this gap. As a result, the resin MR that has entered the gap is transferred to a molded part (flow sensor FS1), and thus a convex shape section CVX1 is formed in the lower surface BS (MR) of the resin (sealing body) MR of the completed flow sensor FS1. That is, a trace of the convex shape section CVX1 is formed in a region to which the ejection pin EJPN is pressed in the lower surface BS (MR) of the completed sealing body.

In addition, as shown in FIG. 18, it is considered that the position of the upper surface SUR (EJ) of the ejection pin EJPN cannot always be processed to be the same height as that of the position of the upper surface SUR (BM) of the lower mold BM. Therefore, for example, as shown in FIG. 18, when the position of the upper surface SUR (EJ) of the ejection pin EJPN is decreased by only a dimension H1 to be lower than the position of the upper surface SUR(BM) of the lower mold BM, the convex shape section CVX1 is formed in a gap portion between the ejection pin EJPN and the insertion hole, and besides, the convex shape section CVX2 is formed in a portion in which the sealing body is brought into contact with the ejection pin EJPN with respect to the lower surface BS (MR) in which the resin MR comes in contact with the upper surface SUR (BM) of the lower mold BM.

Figure 19:
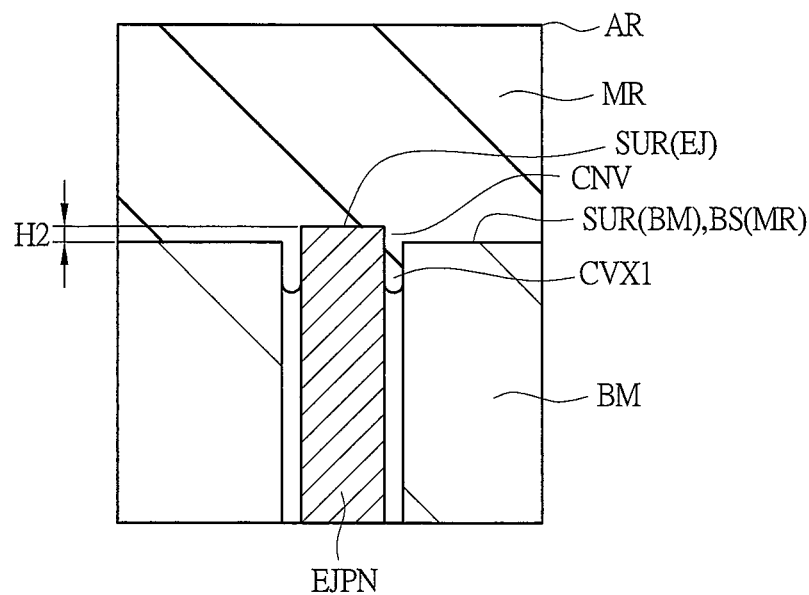
FIG. 19 is a view showing another example of the enlarged view of the region in FIG. 16.

On the other hand, as shown in FIG. 19, when the position of the upper surface SUR (EJ) of the ejection pin EJPN is increased by only a dimension H2 to be higher than the position of the upper surface SUR (BM) of the lower mold BM, the convex shape section CVX1 is formed in a gap portion between the ejection pin EJPN and the insertion hole, and besides, the concave shape section CNV is formed in the portion in which the sealing body is brought into contact with the ejection pin EJPN with respect to the lower surface BS (MR) in which the resin MR comes in contact with the upper surface SUR (BM) of the lower mold BM.

Figure 20:
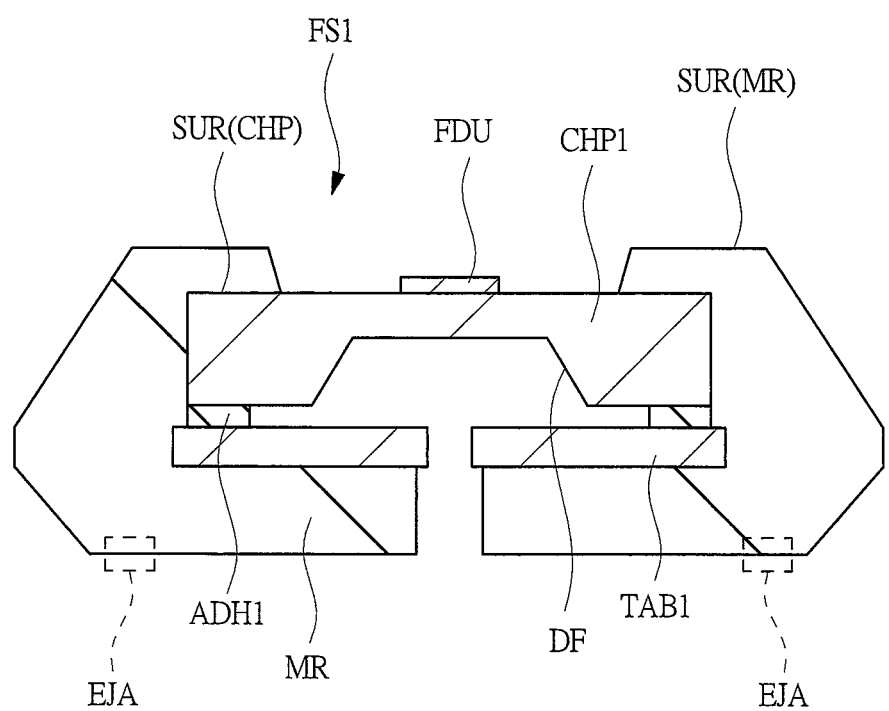
FIG. 20 is a cross-sectional view showing a configuration of the flow sensor according to the first embodiment.

FIG. 20 is a view showing a cross-sectional configuration of the flow sensor FS1 manufactured by the method for manufacturing the flow sensor according to the first embodiment. As described above, the first embodiment has such a feature as employing the configuration in which the vicinity of the periphery (outer edge) of the sealing body is thrust up by the ejection pin. For this reason, in the flow sensor FS1 which is the final product, a trace of the configuration in which the vicinity of the periphery (outer edge) of the sealing body is thrust up by the ejection pin remains. Specifically, as shown in FIG. 20, in the thickness direction of the sealing body, a trace caused by the ejection pin remains in the ejector area EJA which is the outer region of the semiconductor chip CHP1 so as not to overlap with the semiconductor chip CHP1. In other words, the trace caused by the ejection pin remains in the ejector area EJA which is the outer region of the chip mounting section TAB1 so as not to overlap with the chip mounting section TAB1.

<Various Variation of Trace>

These traces have various shapes depending on a size of the gap formed between the ejection pin EJPN and the insertion hole provided in the lower mold BM and on the positional relation between the upper surface SUR (EJ) of the ejection pin EJPN and the upper surface SUR (BM) of the lower mold BM. Hereinafter, the shapes of these various traces will be described by exemplifying FIG. 21A to FIG. 21E.

Figure 21A:
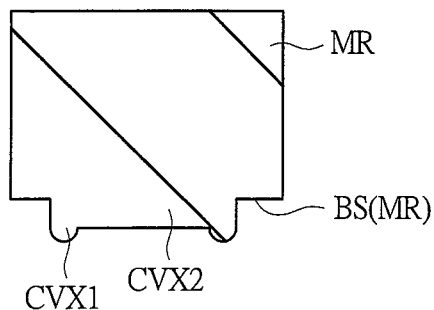
FIG. 21A to 21E are cross-sectional views each showing one example of a trace generated by an ejection pin.

FIG. 21A is a view showing one example of the traces. As shown in FIG. 21A, it can be found that the convex shape section CVX1 and the convex shape section CVX2 are formed in the lower surface BS (MR) of the resin MR. This trace is caused in the resin sealing in a state in which the upper surface SUR (EJ) of the ejection pin EJPN is lower than the upper surface SUR (BM) of the lower mold BM. Thus, the convex shape section CVX2 is formed in the lower surface BS (MR) of the resin MR. Moreover, for example, when a diameter of the insertion hole provided in the lower mold BM is larger than that of the ejection pin EJPN, and when a sufficient gap is caused between the insertion hole provided in the lower mold BM and the ejection pin EJPN, the resin MR enters this gap, and as a result, the convex shape section CVX1 is formed in the periphery of the convex shape section CVX1.

Figure 21B:
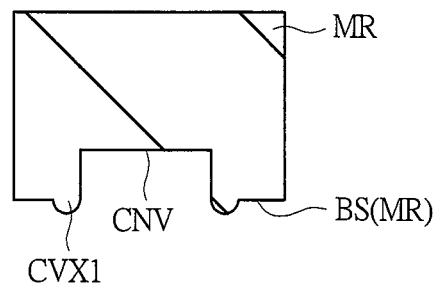

Subsequently, FIG. 21B is a view showing another example of the traces. As shown in FIG. 21B, it can be found that the convex shape section CVX1 and the concave shape section CNV are formed in the lower surface BS (MR) of the resin MR. This trace is caused in the resin sealing in a state in which the upper surface SUR (EJ) of the ejection pin EJPN is higher than the upper surface SUR (BM) of the lower mold BM. Thus, the concave shape section CNV is formed in the lower surface BS (MR) of the resin MR. Moreover, for example, when the diameter of the insertion hole provided in the lower mold BM is larger than that of the ejection pin EJPN, and when the sufficient gap is caused between the insertion hole provided in the lower mold BM and the ejection pin EJPN, the resin MR enters this gap, and as a result, the convex shape section CVX1 is formed in the periphery of the concave shape section CNV.

Figure 21C:
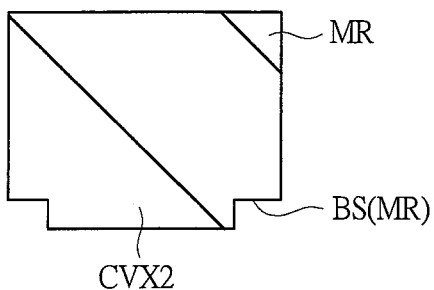

Next, FIG. 21C is a view showing still another example of the traces. As shown in FIG. 21C, it can be found that the convex shape section CVX2 is formed in the lower surface BS (MR) of the resin MR. This trace is caused in the resin sealing in a state in which the upper surface SUR (EJ) of the ejection pin EJPN is lower than the upper surface SUR (BM) of the lower mold BM. Thus, the convex shape section CVX2 is formed in the lower surface BS (MR) of the resin MR. Here, when the dimension of the gap formed between the insertion hole provided in the lower mold BM and the ejection pin EJPN is small, or when a resin viscosity is high which results in a poor transferring property to a resin having a mold shape, the convex shape section CVX1 is not formed in the periphery of the convex shape section CVX2 in some cases as shown in FIG. 21C.

Figure 21D:
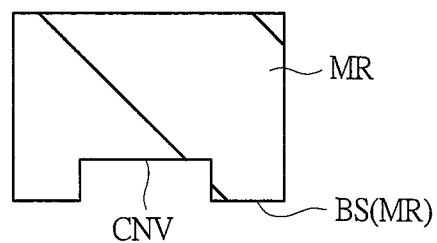

Moreover, FIG. 21D is a view showing another example of the traces. As shown in FIG. 21D, it can be found that the concave shape section CNV is formed in the lower surface BS (MR) of the resin MR. This trace is caused in the resin sealing in a state in which the upper surface SUR (EJ) of the ejection pin EJPN is higher than the upper surface SUR (BM) of the lower mold BM. Thus, the concave shape section CNV is formed in the lower surface BS (MR) of the resin MR. Here, when the dimension of the gap formed between the insertion hole provided in the lower mold BM and the ejection pin EJPN is small, or when a resin viscosity is high which results in a poor transferring property to a resin having a mold shape, the convex shape section CVX1 is not formed in the periphery of the concave shape section CNV in some cases as shown in FIG. 21D.

Figure 21E:
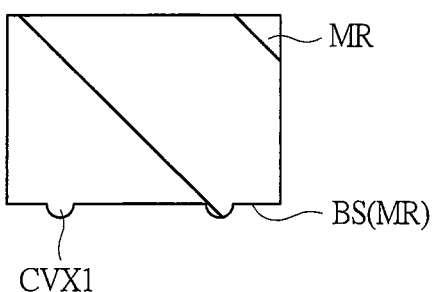

Finally, FIG. 21E is a view showing another example of the traces. As shown in FIG. 21E, it can be found that the convex shape section CVX1 is formed in the lower surface BS (MR) of the resin MR. When the sufficient gap is caused between the insertion hole provided in the lower mold BM and the ejection pin EJPN, this trace is formed as the result of entering of the resin MR into this gap. In FIG. 21E, note that, for example, a case in which the height of the upper surface SUR (BM) of the lower mold BM and the height of the upper surface SUR (EJ) of the ejection pin EJPN are equal to each other is assumed, and therefore, the convex shape section CVX2 and the concave shape section CNV are not formed.

For the reasons described above, it can be found that the shapes of the traces caused by the ejection pin EJPN are formed of at least one convex section or concave section. In the first embodiment, note that the example of each trace TC having, for example, a circular shape has been explained as shown in the trace TC of FIG. 9. However, the technical idea in the first embodiment is not limited to this, and a trace TC having an arbitrary shape such as an elliptical shape or a square shape may be formed by forming the cross-sectional shape of the ejection pin EJPN to have an elliptical shape or a square shape.

<Typical Effect in First Embodiment>

According to the flow sensor FS1 in the first embodiment, the following effect can be obtained.

(1) According to the first embodiment, for example, as shown in FIG. 17, the sealing body is released from the lower mold BM by thrusting up, from the lower mold BM, the ejection pin EJPN arranged in the outer region of the semiconductor chip CHP1 so as not to overlap with the semiconductor chip CHP1 arranged in the vicinity of the center part in an arbitrary cross-sectional surface in parallel to the moving direction of the gas flowing on the exposed flow detecting unit FDU which is formed in the semiconductor chip CHP1. Thus, according to the first embodiment, the deformation applied to the sealing body at the time of mold releasing can be smaller than the case in which the sealing body is released from the lower mold BM by arranging the ejection pin EJPN in the region overlapping with the semiconductor chip CHP1. As a result, the breakage of the diaphragm DF formed in the semiconductor chip CHP1 due to the deformation applied to the sealing body can be prevented. In this manner, the yield of the flow sensor FS1 can be improved, and thus the manufacturing cost of the flow sensor FS1 can be reduced. In the flow sensor FS1 formed as the result, the traces caused by the ejection pin remain in the region of the rear surface region of the sealing body, the region being the outer region of the semiconductor chip CHP1 so as not to overlap with the semiconductor chip CHP1.

(2) Particularly, in the first embodiment, as shown in FIG. 17, the dam bar DM is arranged in the outside of the sealing body, and the positioning pin APN formed in the lower mold BM is inserted into the positioning hole AHL provided in this dam bar DM so as to form the connection part. This connection part is firmly fixed so that the positioning pin is difficult to be released from the positioning hole, and besides, so that the connection part is difficult to be pulled out because the upper part of this connection part is covered by the resin. With regard to this feature, the first embodiment employs the configuration in which the vicinity of the periphery (outer edge) of the sealing body is thrust up by the ejection pin EJPN. For this reason, the thrusting position by the ejection pin EJPN and the position of the connection part get closer to each other, and thus, the connection part is easy to be released, and besides, the deformation of the sealing body having the connection part which is difficult to be released as the fulcrum point can be suppressed. For the reasons described above, according to the first embodiment, the breakage of the diaphragm DF formed in the semiconductor chip CHP1 due to the large deformation applied to the sealing body can be prevented.

(3) According to the first embodiment, for example, as shown in FIG. 16, the resin MR can be sealed in the state in which the semiconductor chip CHP1 having the flow detecting unit FDU formed thereon is fixed by the mold, and therefore, a part of the semiconductor chip CHP1 can be sealed by the resin MR while suppressing the positional shift of the semiconductor chip CHP1. This means that a part of the semiconductor chip CHP1 can be sealed by the resin MR while suppressing the positional shift of each flow sensor FS1 by using the flow sensor FS1 in the first embodiment, and means that the variation in the position of the flow detecting unit FDU formed in the semiconductor chip CHP1 can be suppressed. As a result, according to the first embodiment, the position of the flow detecting unit FDU for detecting the flow rate of a gas can be equalized among the flow sensors FS1, and therefore, an effect capable of suppressing the variation in performance for detecting the gas flow rate in each flow sensor FS1 can be obtained.

(4) According to the first embodiment, for example, as shown in FIG. 16, the semiconductor chip CHP1 is pressed by the upper mold UM through the elastic body film LAF. For this reason, a variation in mounting of the components due to the variation in the thicknesses of the semiconductor chip CHP1, the adhesive ADH1, and the lead frame LF, can be absorbed by the change in the thickness of the elastic body film LAF. In this manner, according to the first embodiment, the clamping force applied to the semiconductor chip CHP1 can be relaxed. As a result, the damage represented by breaking, chipping, and cracking of the semiconductor chip CHP1 can be prevented.

First Modified Example

Subsequently, a first modified example of the flow sensor FS1 according to the above-described first embodiment will be described. In the above-described first embodiment, for example, as shown in FIG. 9, a plurality of traces TC are formed so as to be arranged at the same interval along the long-side direction (X direction) which configures a part of the outer edge of the sealing body. Furthermore, when the short-side direction (Y direction) (direction in parallel to the gas flowing direction) which configures a part of the outer edge of the sealing body is focused the traces TC are formed in the outer region of the semiconductor chip CHP1 so as not to overlap with the semiconductor chip CHP1 when seen in a plan view. On the other hand, in this first modified example, an example of formation of traces TC2 also in the rear surface of the sealing body which overlap with the semiconductor chip CHP1 when seen in a plan view in addition to the above-described plurality of traces TC will be described.

Figure 22:
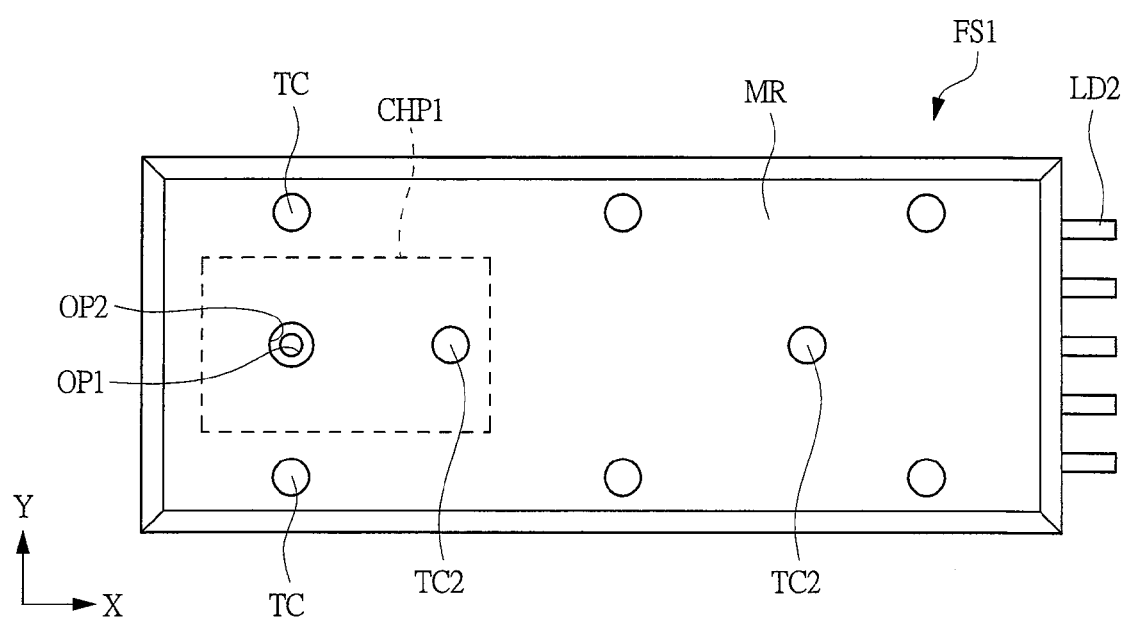
FIG. 22 is a plan view obtained by viewing a flow sensor according to a first modified example from a rear surface side.

FIG. 22 is a plan view obtained by viewing a flow sensor FS1 according to the first modified example from the rear surface side. As shown in FIG. 22, in the flow sensor FS1 in the first modified example, a plurality of traces TC and traces TC2 are formed in the rear surface of the sealing body made of the resin MR. These traces TC and traces TC2 are formed at the time of mold releasing of the sealing body from the lower mold by thrusting up the sealing body by the ejection pin EJPN after the resin-sealing step.

In this case, also in the first modified example, when seen in a plan view, the traces TC caused by pressing the ejection pin EJPN are formed in the rear surface of the sealing body (resin MR) of the outer region of the semiconductor chip CHP1s so as not to overlap with the semiconductor chip CHP1. Therefore, also in the first modified example, the deformation applied to the sealing body at the time of mold releasing can be reduced as similar to the above-described first embodiment, and as a result, it can be found that the diaphragm DF formed in the semiconductor chip CHP1 can be prevented from being broken by the deformation applied to the sealing body.

However, in the first modified example, as shown in FIG. 22, the traces TC2 caused by the ejection pin EJPN are formed also in the rear surface of the resin MR (sealing body) overlapping with the semiconductor chip CHP1 when seen in a plan view. This means that, in the first modified example, at the time of mold releasing, the ejection pin EJPN is pressed also against the rear surface of the resin MR (sealing body) overlapping with the semiconductor chip CHP1 when seen in a plan view. In this case, there is concern that the diaphragm DF formed in the semiconductor chip CHP1 is broken by a load caused by the ejection pin EJPN. However, mold releasing of the sealing body from the lower mold BM is devised as described below, so that mold releasing property is improved. This point will be described.

For example, in the first modified example, when the sealing body is mold-released from the lower mold BM, first, the ejection pin EJPN is pressed against the rear surface of the sealing body (resin MR) in the outer region of the semiconductor chip CHP1 so as not to overlap with the semiconductor chip CHP1, and thus the sealing body (resin MR) is slightly mold-released from the lower mold BM (first stage). Furthermore, after the sealing body (resin MR) is separated from the lower mold BM, in addition to the above-described thrusting by the ejection pin EJPN, thrusting by the ejection pin EJPN is applied also to the rear surface of the resin MR (sealing body) overlapping with the semiconductor chip CHP1 (second stage). In this manner, mold releasing of the sealing body from the lower mold BM in the first modified example can be performed.

In this case, first, by the mold releasing of the first stage, the vicinity of the periphery (outer edge) of the sealing body (resin MR) is thrust up by the ejection pin EJPN, and therefore, the thrusting position by the ejection pin EJPN and the position of the connection part get closer to each other, so that the connection part is easy to be released, and besides, the deformation of the sealing body having the connection part which is difficult to be mold-released as the fulcrum point can be suppressed. Furthermore, once the mold releasing of first stage is completed, the deformation of the sealing body having the connection part as the fulcrum point is difficult to be caused since the mold releasing of the connection part is completed. For this reason, at this time, by the mold releasing of the second stage, the thrusting by the ejection pin EJPN is applied also to the rear surface of the resin MR (sealing body) overlapping with the semiconductor chip CHP1 when seen in a plan view. As a result, according to the first modified example, the number of the ejection pin EJPN for ejecting the sealing body increases, and as a result, loads applied to the rear surface of the sealing body can be equalized to each other, and thus the sealing body (resin MR) can be smoothly released. That is, in the first modified example, by performing the mold releasing from the lower mold BM of the sealing body (resin MR) with the combination of the first stage and the second stage, the mold releasing property of the sealing body (resin MR) from the lower mold BM can be further improved while preventing the breakage of the diaphragm DF formed in the semiconductor chip CHP1 at the time of mold releasing.

Second Modified Example

Next, a second modified example of the flow sensor FS1 according to the above-described first embodiment will be described. In the above-described first embodiment, for example, as shown in FIG. 8B or FIG. 8C, the example of the arrangement of the semiconductor chip CHP1 on the chip mounting section TAB1 through the adhesive ADH1 has been described. In the second modified example, an example in which a plate-like structure PLT is inserted between the semiconductor chip CHP1 and the chip mounting section TAB1 will be described.

Figures 23A, 23B, 23C:
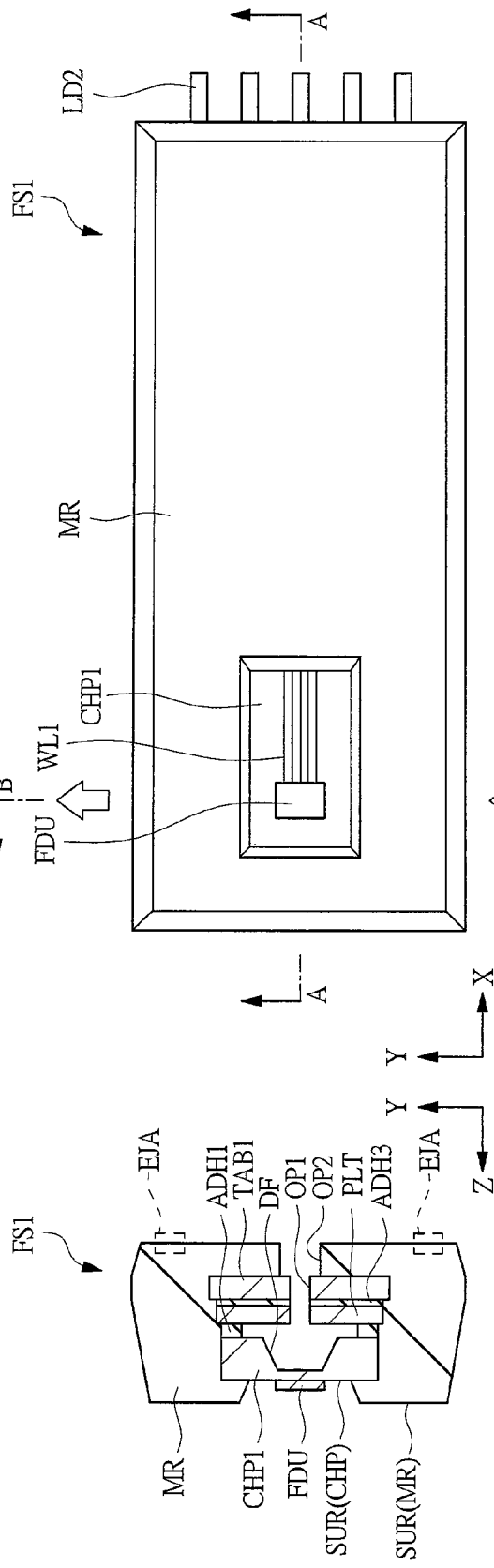
FIG. 23A is a plan view showing a structure of a flow sensor after resin-sealing in a second modified example.
FIG. 23B is a cross-sectional view obtained by cutting FIG. 23A on a line A-A.
FIG. 23C is a cross-sectional view obtained by cutting FIG. 23A on a line B-B.

FIGS. 23A to 23C are views each showing a structure of the flow sensor FS1 after resin-sealing in the second modified example. In FIGS. 23A to 23C, FIG. 23A is a plan view showing the structure of the flow sensor FS1 after the resin sealing, and FIG. 23B is a cross-sectional view obtained by cutting FIG. 23A on a line A-A, and FIG. 23C is a cross-sectional view obtained by cutting FIG. 23A on a line B-B.

As shown in FIG. 23B or FIG. 23C, it can be found that, in the flow sensor FS1 in the second modified example, the plate-like structure PLT is formed over a lower layer of the semiconductor chip CHP1 and a lower layer of the semiconductor chip CHP2. This plate-like structure PLT has, for example, a rectangular shape, and has such an external dimension that the semiconductor chip CHP1 and the semiconductor chip CHP2 are enclosed when seen in a plan view.

Specifically, as shown in FIG. 23B, the plate-like structure PLT is arranged on the chip mounting section TAB1 and the chip mounting section TAB2. This plate-like structure PLT is adhered to the chip mounting section TAB1 and the chip mounting section TAB2 with the use of, for example, an adhesive ADH3, and can also be bonded with the use of a paste material. Furthermore, on this plate-like structure PLT, the semiconductor chip CHP1 is mounted through the adhesive ADH1, and the semiconductor chip CHP2 is mounted through the adhesive ADH2. At this time, when the plate-like structure PLT is made of a metallic material, the PLT can be connected with the semiconductor chip CHP1 by a wire and can also be connected with the semiconductor chip CHP2 by a wire. Note that not only the above-described plate-like structure PLT but also a component such as a capacitor or thermistor can be mounted on the chip mounting section TAB1 and the chip mounting section TAB2.

The above-described plate-like structure PLT mainly functions for improvement of the stiffness of the flow sensor FS1 and functions as a buffer material against an impact from outside. Moreover, when the plate-like structure PLT is made of an electrical conducting material, the PLT can be electrically connected to the semiconductor chip CHP1 (pad PD1) and the semiconductor chip CHP2 (pad PD2) and be used also for supplying a ground potential (reference potential), and can achieve the stabilization of the ground potential. For example, when a material having higher stiffness such as a metallic material is used for plate-like structure PLT, the stiffness of the flow sensor FS1 can be improved. Meanwhile, when a material having lower stiffness such as a resin material is used, in the resin-sealing step, the variation in mounting of the components clamped between the upper mold UM and the lower mold BM can be absorbed by the deformation of the plate-like structure PLT.

The plate-like structure PLT can be made of, for example, a thermoplastic resin such as PBT resin, ABS resin, PC resin, nylon resin, PS resin, PP resin and a fluorine resin, and a thermosetting resin such as epoxy resin, phenol resin and urethane resin. In this case, the plate-like structure PLT can mainly function as a buffer material for protecting the semiconductor chip CHP1 and the semiconductor chip CHP2 from an external impact.

Meanwhile, the plate-like structure PLT can be formed by pressing a metallic material such as iron alloy, aluminum alloy, or copper alloy, and can also be made of a glass material. Particularly, when the plate-like structure PLT is made of a metallic material, the stiffness of the flow sensor FS1 can be enhanced. Furthermore, the plate-like structure PLT can also be used for the supply of a ground potential and the stabilization of the ground potential by electrically connecting the plate-like structure PLT to the semiconductor chip CHP1 and the semiconductor chip CHP2.

Note that, when the plate-like structure PLT is made of a thermoplastic resin or a thermosetting resin, an inorganic filler such as glass, talc, silica and mica, and an organic filler such as carbon can be filled in the thermoplastic resin or the thermosetting resin. Furthermore, the plate-like structure PLT can be mold-formed by filling a resin into a mold by a transfer molding method, and formed by appropriately laminating a sheet-like component by roll machining.

Also in such a flow sensor FS1 as configured in the second modified example, a mold releasing step same as similar to that of the above-described first embodiment can be achieved. For example, as shown in FIG. 17, the sealing body can be released from the lower mold BM by thrusting up, from the lower mold BM, the ejection pin EJPN arranged in the outer region of the semiconductor chip CHP1 so as not to overlap with the semiconductor chip CHP1 arranged in the vicinity of the center part in an arbitrary cross-sectional surface in parallel to the moving direction of the gas flowing on the exposed flow detecting unit FDU which is formed in the semiconductor chip CHP1. Thus, also in the second modified example, the deformation applied to the sealing body at the time of mold releasing can be smaller than a case in which the sealing body is released from the lower mold BM by arranging the ejection pin EJPN in the region overlapping with the semiconductor chip CHP1. As a result, the breakage of the diaphragm DF formed in the semiconductor chip CHP1 due to the deformation applied to the sealing body can be prevented. In this manner, the yield of the flow sensor FS1 can be improved, and thus the manufacturing cost of the flow sensor FS1 can be reduced. As a result, in the flow sensor FS1 in the second modified example, a trace caused by the ejection pin EJPN remains in a region of the rear surface region of the sealing body, the region being the outer region of the semiconductor chip CHP1 so as not to overlap with the semiconductor chip CHP1.

Second Embodiment

In the above-described first embodiment, for example, as shown in FIG. 8B, the flow sensor FS1 having the two-chip structure of the semiconductor chip CHP1 and the semiconductor chip CHP2 has been exemplified for the explanation. The technical idea of the present invention is not limited to this, and can also be applied to, for example, a flow sensor having a one-chip structure of one semiconductor chip with a flow detecting unit and a control unit (control circuit) integrally formed thereon. In the second embodiment, a case in which the technical idea of the present invention is applied to the flow sensor having one-chip structure will be exemplified for the explanation.

<Mounting Configuration of Flow Sensor according to Second Embodiment>

FIGS. 24A to 24C are views each showing a mounting configuration of the flow sensor FS2 according to the second embodiment, which is a view illustrating a configuration after sealing by the resin. Particularly, FIG. 24A is a plan view showing a mounting configuration of the flow sensor FS2 according to the second embodiment. FIG. 24B is a cross-sectional view obtained by cutting FIG. 24A on a line A-A, and FIG. 24C is a cross-sectional view obtained by cutting FIG. 24A on a line B-B. Particularly, FIG. 24B shows one cross-sectional surface in parallel to the moving direction of the gas flowing on the exposed flow detecting unit FDU. In FIG. 24B, the gas flows, for example, from a left side to a right side along an "X" axis.

First, as shown in FIG. 24A, the flow sensor FS2 according to the second embodiment has the sealing body containing the resin MR having a rectangular shape, and the lead LD2 is protruded from the resin MR. Furthermore, a part of the semiconductor chip CHP1 is exposed from the upper surface (front surface) of the resin MR. Particularly, in the semiconductor chip CHP1, the flow detecting unit FDU and a control unit for controlling this flow detecting unit FDU are formed. Specifically, the flow detecting unit FDU formed in the semiconductor chip CHP1 is electrically connected with the control unit by the wiring WL1. Although this control unit is not shown in FIG. 24A because of being covered by the resin MR, this is arranged inside the resin MR. That is, the flow sensor FS2 according to the second embodiment is configured so as to have the semiconductor chip CHP1 including the flow detecting unit FDU and the control unit integrally formed thereon and so as to expose the flow detecting unit FDU from the resin MR.

Next, as shown in FIG. 24B, in the flow sensor FS2 according to the second embodiment, it can be found that the semiconductor chip CHP1 is mounted on the chip mounting section TAB1 through the adhesive ADH1. At this time, the flow detecting unit FDU is formed on the upper surface (front surface, main surface) of the semiconductor chip CHP1, and the diaphragm DF (thin plate section) is formed on the rear surface of the semiconductor chip CHP1 which faces this flow detecting unit FDU. On the other hand, the opening OP1 is formed in the bottom portion of the chip mounting section TAB1 existing below the diaphragm DF.

Note that, for example, a thermosetting resin such as epoxy resin and polyurethane resin, and a thermoplastic resin such as polyimide resin and acrylic resin can be used for the adhesive ADH1 which bonds the semiconductor chip CHP1 with the chip mounting section TAB1.

Here, as shown in FIG. 24B, in the flow sensor FS2 according to the second embodiment, the resin MR is formed so as to cover a part of the side surface and the upper surface of the semiconductor chip CHP1 and a part of the chip mounting section TAB1.

At this time, in the second embodiment, the opening OP1 is formed in the bottom portion of the chip mounting section TAB1 below the diaphragm DF formed in the rear surface of the semiconductor chip CHP1, and further, the opening OP2 is provided in the resin MR which covers the rear surface of the chip mounting section TAB1.

Thus, according to the flow sensor FS2 in the second embodiment, the internal space of the diaphragm DF communicates with an external space of the flow sensor FS2 through the opening OP1 formed in the bottom portion of the chip mounting section TAB1 and the opening OP2 formed in the resin MR. As a result, the pressure of the internal space of the diaphragm DF and the pressure of the external space of the flow sensor FS2 can be equalized to each other, and thus a stress applied onto the diaphragm DF can be suppressed. Moreover, also in the second embodiment, as shown in FIG. 24B, the upper surface SUR (MR) of the resin MR is formed so as to be higher than the upper surface SUR (CHP) of the semiconductor chip CHP1.

As shown in FIG. 24C, note that the semiconductor chip CHP1 is mounted on the chip mounting section TAB1 through the adhesive ADH1. However, it can be found that the flow detecting unit FDU and the control unit CU are formed in the upper surface of this semiconductor chip CHP1. That is, in the second embodiment, it can be found that the flow detecting unit FDU and the control unit CU are integrally formed with each other in the semiconductor chip CHP1. Moreover, the pad PD is formed in the upper surface of the semiconductor chip CHP1, and this pad PD and the lead LD2 are electrically connected with each other by the wire W. Furthermore, the control unit CU, pad PD and wire W, which are formed in the upper surface of the semiconductor chip CHP1, are sealed by the resin MR.

Also in such a flow sensor FS2 as configured in the second embodiment, a mold releasing step which is the same idea as that of the above-described first embodiment can be performed. For example, the sealing body can be released from the lower mold by thrusting up, from the lower mold, the ejection pin arranged in the outer region of the semiconductor chip CHP1 so as not to overlap with the semiconductor chip CHP1 arranged in the vicinity of the center part in an arbitrary cross-sectional surface in parallel to the moving direction of the gas flowing on the exposed flow detecting unit FDU which is formed in the semiconductor chip CHP1. Thus, also in the second embodiment, the deformation applied to the sealing body at the time of mold releasing can be smaller than the case in which the sealing body is released from the lower mold by arranging the ejection pin in the region overlapping with the semiconductor chip CHP1. As a result, the breakage of the diaphragm DF formed in the semiconductor chip CHP1 due to the deformation applied to the sealing body can be prevented. Thus, the yield of the flow sensor FS2 can be improved, and thus the manufacturing cost of the flow sensor FS2 can be reduced. As a result, also in the flow sensor FS2 according to the second embodiment, the trace caused by the ejection pin remains in the region of the rear surface region of the sealing body, the region being the outer region of the semiconductor chip CHP1 so as not to overlap with the semiconductor chip CHP1.

Figure 25:
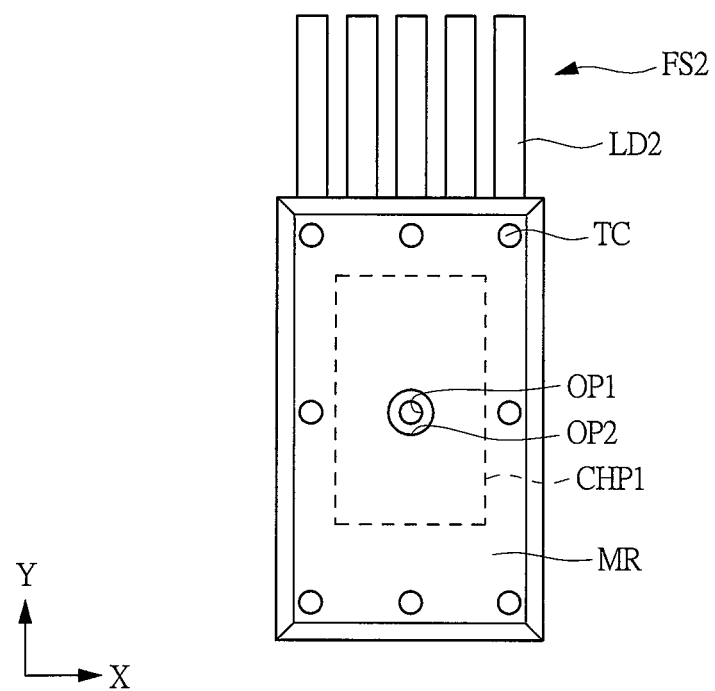
FIG. 25 is a plan view obtained by viewing the flow sensor in the second embodiment from a rear surface side.

FIG. 25 is a plan view obtained by viewing the flow sensor FS2 according to the second embodiment from the rear surface side. As shown in FIG. 25, the flow sensor FS2 according to the second embodiment has a rectangular-shaped sealing body made of a resin MR, and a plurality of leads LD2 are protruded from this resin MR. Furthermore, as shown with the dashed line in FIG. 25, the semiconductor chip CHP1 is embedded inside the sealing body made of the resin MR, and the opening OP1 and the opening OP2 which communicate with the diaphragm formed on this semiconductor chip CHP1 are formed. The opening OP1 is provided in the chip mounting section on which the semiconductor chip CHP1 is mounted, and the opening OP2 is provided in the resin MR which configures the sealing body. As can be seen from FIG. 25, a diameter of the opening OP2 is larger than that of the opening OP1.

Furthermore, as shown in FIG. 25, a plurality of traces TC caused by the ejection pin remain in the rear surface of the sealing body which configures the flow sensor FS2. Specifically, as shown in FIG. 25, a plurality of traces TC are arranged at the same interval so as to surround the periphery of the outer edge of the sealing body. Furthermore, also in the second embodiment, it can be found that the traces TC are formed in the outer region of the semiconductor chip CHP1 so as not to overlap with the semiconductor chip CHP1 when seen in a plan view. In other words, it can be found that the traces TC are formed in a region sandwiched by the semiconductor chip CHP1 and the outer edge region of the sealing body when seen in a plan view. Therefore, in the flow sensor FS2 according to the second embodiment, the traces TC caused by the mold releasing step performed by the ejection pin after the resin-sealing step remain, and therefore, it can be specified at which position of the sealing body the ejection pin has been pressed in the mold releasing step after the resin-sealing step by checking the rear surface of the flow sensor FS2 which is the final product.

In the foregoing, the invention made by the present inventors has been concretely described based on the embodiments. However, it is needless to say that the present invention is not limited to the foregoing embodiments and various modifications and alterations can be made within the scope of the present invention.

The flow sensor explained in the above-described embodiment is a device for measuring a flow rate of a gas. However, a specific type of the gas is not limited, and the flow sensor can be widely applied as a device for measuring a flow rate of an arbitrary gas such as air, LP gas, carbonic acid gas ($CO_2$ gas) and fluorocarbon gas.

In addition, in the above-described embodiment, a flow sensor for measuring the flow rate of a gas has been described. However, the technical idea of the present invention is not limited to this, and can also be widely applied to a semiconductor device in which a semiconductor element such as a humidity sensor is resin-sealed while a part of the semiconductor element is exposed.

INDUSTRIAL APPLICABILITY

The present invention can be widely used in, for example, manufacturing industries for manufacturing a semiconductor device such as a flow sensor.

SYMBOL EXPLANATION

1 CPU
2 input circuit
3 output circuit
4 memory
ADH1 adhesive
ADH2 adhesive
ADH3 adhesive
AHL positioning hole
APN positioning pin
AR area
BM lower mold
BR1 downstream resistance thermometer
BR2 downstream resistance thermometer
BS (MR) lower surface
CHP1 semiconductor chip
CHP2 semiconductor chip
CNV concave shape section
CVX1 convex shape section
CVX2 convex shape section
DF diaphragm
DM dam bar
EJA ejector area
EJPN ejection pin
EPLT ejection pin plate
FDU flow detecting unit
FS1 flow sensor
FS2 flow sensor
FSP flow sensor
HCB heater control bridge
HR heating resistor
IP1 insert piece
LAF elastic body film
LD1 lead
LD2 lead
LF lead frame
MR resin
OP1 opening
OP2 opening
PD pad
PD1 pad
PD2 pad
PD3 pad
PJ plunger
PLT plate-like structure
PS power source
Q gas flow rate
R1 resistor
R2 resistor
R3 resistor
R4 resistor
SP1 first space
SPR spring
SUR (BM) upper surface
SUR (CHP) upper surface
SUR (EJ) top surface
SUR (MR) top surface
TAB1 chip mounting section
TAB2 chip mounting section
TC trace TC2 trace
Tr transistor
TSB temperature sensor bridge
UM upper mold
UR1 upstream resistance thermometer
UR2 upstream resistance thermometer
Vref1 reference voltage
Vref2 reference voltage
W wire
W1 wire
W2 wire
W3 wire
WL1 wiring

The invention claimed is:

1. A method for manufacturing a flow sensor having:
a first chip mounting section; and
a first semiconductor chip arranged on the first chip mounting section,
the first semiconductor chip having:
   a flow detecting unit formed on a main surface of a first semiconductor substrate; and
   a diaphragm formed in a region of a rear surface on an opposite side of the main surface of the first semiconductor substrate so as to face the flow detecting unit, and
a part of the first semiconductor chip being sealed by a sealing body containing a resin in a state in which the flow detecting unit formed in the first semiconductor chip is exposed,
the method comprising the steps of:
(a) preparing a base material having the first chip mounting section;
(b) preparing the first semiconductor chip;
(c) mounting the first semiconductor chip on the first chip mounting section; and
(d) after the step of (c), sealing a part of the first semiconductor chip by the sealing body while exposing the flow detecting unit formed in the first semiconductor chip,
wherein the step of (d) includes the steps of:
   (d1) preparing an upper mold and a lower mold into which an ejection pin has been inserted;
   (d2) after the step of (d1), sandwiching the base material having the first semiconductor chip mounted thereon by the upper mold and the lower mold through a second space while pressing a part of the upper mold against an upper surface of the first semiconductor chip and forming a first space surrounding the flow detecting unit between the upper mold and the first semiconductor chip;
   (d3) after the step of (d2), casting the resin into the second space;
   (d4) after the step of (d3), forming the sealing body by hardening the resin; and
   (d5) after the step of (d4), releasing the sealing body from the lower mold, and,
in the step of (d5), the sealing body is released from the lower mold by thrusting up, from the lower mold, the ejection pin arranged outside a vertical cross-sectional perimeter of the first semiconductor chip.

2. The method for manufacturing the flow sensor according to claim 1,
wherein the base material has a dam bar arranged in periphery of the first chip mounting section, and
the ejection pin is arranged internal to a vertical cross-sectional perimeter of the dam bar.

3. The method for manufacturing the flow sensor according to claim 2,
wherein a positioning hole is provided in the dam bar,
a positioning pin is provided in the lower mold at a position corresponding to the positioning hole, and,
in the step of (d2), the base material is fixed to the lower mold by inserting the positioning pin provided in the lower mold into the positioning hole provided in the dam bar.

4. The method for manufacturing the flow sensor according to claim 1,
wherein a diameter of an insertion hole provided in the lower mold into which the ejection pin is inserted is larger than a diameter of the ejection pin,
the resin enters a part of a gap between the insertion hole and the ejection pin in the step of (d3), and thus, a first convex-shape section is formed in a lower surface of the sealing body in the step of (d4).

5. The method for manufacturing the flow sensor according to claim 1,
wherein a height of a tip part of the ejection pin is higher than a height of an upper surface of the lower mold in the step of (d3), and thus, a concave section whose bottom surface recesses so as to be inner than a lower surface of the sealing body is formed in the lower surface of the sealing body in the step of (d4).

6. The method for manufacturing the flow sensor according to claim 1,
wherein a height of a tip part of the ejection pin is lower than a height of an upper surface of the lower mold in the step of (d3), and thus, a second convex-shape section is formed in a lower surface of the sealing body in the step of (d4).

7. A method for manufacturing the flow sensor according to claim 1,
wherein the ejection pin is provided between a vertical cross-sectional perimeter of one end of the first semiconductor chip and a vertical cross-sectional perimeter of an external wall of the sealing body.

8. The method for manufacturing the flow sensor according to claim 1,
wherein the ejection pin is provided outside a vertical cross-sectional perimeter of the first chip mounting section.

9. The method for manufacturing the flow sensor according to claim 1,
wherein the first semiconductor chip further has a control circuit unit for controlling the flow detecting unit.

10. The method for manufacturing the flow sensor according to claim 1, further comprising the step of:
(e) before the step of (c), preparing a second semiconductor chip having a control circuit unit for controlling the flow detecting unit,
wherein the base material prepared in the step of (a) has a second chip mounting section,
in the step of (c), the second semiconductor chip is mounted on the second chip mounting section,
in the step of (d), the second semiconductor chip is sealed by the sealing body,
in the step of (d2), the base material having the first semiconductor chip and the second semiconductor chip mounted thereon is sandwiched by the upper mold and the lower mold through the second space while forming the first space surrounding the flow detecting unit by pressing a bottom surface of the upper mold against the first semiconductor chip.

* * * * *